(12) United States Patent
Saito et al.

(10) Patent No.: US 8,750,022 B2
(45) Date of Patent: Jun. 10, 2014

(54) SEMICONDUCTOR MEMORY DEVICE AND SEMICONDUCTOR DEVICE

(75) Inventors: Toshihiko Saito, Atsugi (JP); Yasuyuki Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 258 days.

(21) Appl. No.: 13/079,032

(22) Filed: Apr. 4, 2011

(65) Prior Publication Data

US 2011/0249487 A1    Oct. 13, 2011

(30) Foreign Application Priority Data

Apr. 9, 2010   (JP) .................................. 2010-089968

(51) Int. Cl.
   *G11C 7/12*    (2006.01)

(52) U.S. Cl.
   USPC .......................................................... 365/149

(58) Field of Classification Search
   USPC .................................................. 365/189.011
   See application file for complete search history.

(56) References Cited

U.S. PATENT DOCUMENTS

| | | |
|---|---|---|
| 3,833,894 A | 9/1974 | Aviram et al. |
| 4,763,183 A | 8/1988 | Ng et al. |
| 5,242,851 A | 9/1993 | Choi |
| 5,268,874 A | 12/1993 | Yamauchi |
| 5,583,819 A | 12/1996 | Roesner et al. |
| 5,650,974 A | 7/1997 | Yoshimura |
| 5,710,738 A | 1/1998 | Tai |
| 5,731,856 A | 3/1998 | Kim et al. |
| 5,744,864 A | 4/1998 | Cillessen et al. |
| 5,821,138 A | 10/1998 | Yamazaki et al. |
| 5,828,612 A | 10/1998 | Yu et al. |
| 6,051,851 A | 4/2000 | Ohmi et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

"Sense of Crisis" is a trigger. Ignited Evolution of a Sesame-Grain Sized Chip Technology Development is Entering into the Second Phase, Nikkei Electronics, Nov. 18, 2002, No. 835, pp. 67-76.

(Continued)

*Primary Examiner* — Huan Hoang
*Assistant Examiner* — Min Huang
(74) *Attorney, Agent, or Firm* — Eric J. Robinson; Robinson Intellectual Property Law Office, P.C.

(57) ABSTRACT

A semiconductor memory device or a semiconductor device which has high reading accuracy is provided. A bit line, a word line, a memory cell placed in an intersection portion of the bit line and the word line, and a reading circuit electrically connected to the bit line are provided. The memory cell includes a first transistor and an antifuse. The reading circuit includes a pre-charge circuit, a clocked inverter, and a switch. The pre-charge circuit includes a second transistor and a NAND circuit. The semiconductor memory device includes transistor in each of which an oxide semiconductor is used in a channel formation region, as the first transistor and the second transistor.

26 Claims, 12 Drawing Sheets

(56) References Cited

U.S. PATENT DOCUMENTS

| | | |
|---|---|---|
| 6,094,379 A | 7/2000 | Sago |
| 6,100,804 A | 8/2000 | Brady et al. |
| 6,160,733 A | 12/2000 | Ebel |
| 6,164,551 A | 12/2000 | Altwasser |
| 6,239,703 B1 | 5/2001 | Friedman et al. |
| 6,294,274 B1 | 9/2001 | Kawazoe et al. |
| 6,534,841 B1 | 3/2003 | Van Brocklin et al. |
| 6,563,174 B2 | 5/2003 | Kawasaki et al. |
| 6,587,392 B2 | 7/2003 | Ooishi |
| 6,654,275 B2 | 11/2003 | Forbes |
| 6,667,921 B2 | 12/2003 | Park |
| 6,720,866 B1 | 4/2004 | Sorrells et al. |
| 6,727,522 B1 | 4/2004 | Kawasaki et al. |
| 6,856,563 B2 | 2/2005 | Kim et al. |
| 6,870,461 B2 | 3/2005 | Fischer et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,868 B2 | 6/2006 | Thean et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,453,427 B2 | 11/2008 | Kimura |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0227749 A1 | 11/2004 | Kimura |
| 2005/0007181 A1 | 1/2005 | Kimura |
| 2005/0017302 A1 | 1/2005 | Hoffman |
| 2005/0035792 A1 | 2/2005 | Kimura |
| 2005/0083272 A1 | 4/2005 | Kimura |
| 2005/0128827 A1 | 6/2005 | Shionoiri et al. |
| 2005/0134463 A1 | 6/2005 | Yamazaki |
| 2005/0174845 A1 | 8/2005 | Koyama et al. |
| 2005/0199959 A1 | 9/2005 | Chiang et al. |
| 2005/0263767 A1 | 12/2005 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214008 A1 | 9/2006 | Asami et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0261331 A1 | 11/2006 | Yukawa |
| 2006/0263634 A1 | 11/2006 | Yamazaki |
| 2006/0284171 A1 | 12/2006 | Levy et al. |
| 2006/0284172 A1 | 12/2006 | Ishii |
| 2006/0284800 A1 | 12/2006 | Kimura |
| 2006/0292777 A1 | 12/2006 | Dunbar |
| 2007/0001205 A1 | 1/2007 | Kimura |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0064511 A1 | 3/2007 | Shionoiri et al. |
| 2007/0090365 A1 | 4/2007 | Hayashi et al. |
| 2007/0105285 A1 | 5/2007 | Kusumoto et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0080295 A1* | 4/2008 | Namekawa et al. ...... 365/230.06 |
| 2008/0083954 A1 | 4/2008 | Tokunaga |
| 2008/1008395 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0059650 A1 | 3/2009 | Saito |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0317968 A1* | 12/2009 | Nagata .......................... 438/600 |
| 2010/0061149 A1* | 3/2010 | Hosono et al. ........... 365/185.03 |
| 2010/0065844 A1 | 3/2010 | Tokunaga |
| 2010/0072474 A1 | 3/2010 | Abe et al. |
| 2010/0078700 A1 | 4/2010 | Saito |
| 2010/0092800 A1 | 4/2010 | Itagaki et al. |
| 2010/0109002 A1 | 5/2010 | Itagaki et al. |
| 2010/0224872 A1* | 9/2010 | Kimura .......................... 257/43 |
| 2010/0265754 A1 | 10/2010 | Saito |
| 2011/0115839 A1* | 5/2011 | Takahashi et al. ............. 345/698 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-023653 A | 1/1990 |
| JP | 05-089685 A | 4/1993 |
| JP | 05-251705 A | 9/1993 |
| JP | 07-297293 A | 11/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-299440 A | 10/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-003974 A | 1/2009 |
| JP | 2010-028105 A | 2/2010 |
| WO | WO-2004/114391 | 12/2004 |

OTHER PUBLICATIONS

Takahashi et al., Sesame-Grain Sized Chip as Source, Nikkei Electronics, Feb. 25, 2002, No. 816, pp. 109-137.

Ito, M., "Basic technology was established for evaluating oxide semiconductor TFT, and application is a key of practical use.,", Nikkei Microdevices, Apr. 1, 2009, No. 4, pp. 53-58.

International Search Report (Application No. PCT/JP2011/056510) Dated Jun. 14, 2011.

Written Opinion (Application No. PCT/JP2011/056510) Dated Jun. 14, 2011.

Kamiya et al., "Carrier transport properties and electronic structures of amorphous oxide semiconductors: the present status,", Solid State Physics, Sep. 1, 2009, vol. 44, No. 9, pp. 621-633, Agne Gijutsu Center.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1:Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.n. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No.3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technoology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp.633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4th, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and its Bending Properties,", SID Digest '09 : SID International Symposium Digest of Technical Papers, May 31, 2009, pp. 983-985.

Sakata.J et al., "Development of 4.0-in. Amoled Display With Driver Circuit Using Amorphous In-Ga-Zn-Oxide TFTS,", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTS and Their Application for Large Sized Amoled,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA Amoled Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.n. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN]at Temperatures Over 1000°C,", Journal of Solid State Chemistry, 1985, vol. 60, pp.382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A. (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR MEMORY DEVICE AND SEMICONDUCTOR DEVICE

TECHNICAL FIELD

The present invention relates to a semiconductor memory device or a semiconductor device on which the semiconductor memory device is mounted. In particular, the present invention relates to a semiconductor memory device provided with an antifuse.

BACKGROUND ART

A technique called RFID (radio frequency identification) has attracted attention and has been applied to various fields such as distribution, historical management, article management, presence management, or the like. RFID refers to an exchange of data with the use of a wireless communication technique in a narrow sense. A semiconductor device called an RFID tag (also referred to as an RF tag, an ID tag, an IC tag, or a wireless tag) is used for RFID, and wireless communication is performed between an RFID tag and a communication device such as a reader/writer, so that reading or writing of data can be performed.

By including a memory (also called a memory element) in an RFID tag, a high performance RFID tag can be obtained. In particular, it is preferable that a memory which is one kind of involatile memory devices and to which writing can be performed only once be included in an RFID tag because interpolation of data is not easily performed and security is improved. Such a memory to which writing can be performed only once is referred to as a one-time programmable memory (hereinafter also referred to as an OTP memory, or simply an OTP in this specification) or the like.

As examples of an OTP memory, an antifuse capable of writing data by controlling a conductive state (a low resistance state) and a non-conductive state (a high resistance state) and a fuse type memory such as a fuse are known. For example, an antifuse is known, in which when voltage is applied to both ends of an element using amorphous silicon, silicide is formed in an electrode to short-circuit (see Patent Document 1).

In addition, in order to reduce delay time for reading data from a memory cell in a semiconductor memory such as a RAM, pre-charge of a bit line before performing reading operation is proposed (see Patent Document 2).

REFERENCE

Patent Document

[Patent Document 1] Japanese Published Patent Application No. 07-297293
[Patent Document 2] Japanese Published Patent Application No. H5-089685

DISCLOSURE OF INVENTION

An object of an embodiment of the present invention is to provide a semiconductor memory device or a semiconductor device which has high reading accuracy.

An object of an embodiment of the present invention is to downsize a semiconductor memory device or a semiconductor device.

An embodiment of the disclosed invention is a semiconductor memory device or a semiconductor device using a transistor in which a material which can reduce off current sufficiently is used in a channel formation region, specifically, a transistor in which an oxide semiconductor is used in a channel formation region, as a transistor included in a memory cell and a transistor in a reading circuit.

As a transistor included in a memory cell, in particular, as a transistor electrically connected to an antifuse, a transistor in which a material which can reduce off current sufficiently is used in a channel formation region is used, thereby enabling to shorten a pre-charge period and secure a sufficient reading period. Further, as a transistor in a reading circuit, in particular, a transistor included in a pre-charge circuit and placed between the pre-charge circuit and an output signal line, a transistor in which a material which can reduce off current sufficiently is used in a channel formation region is used, thereby enabling prevention of incorrect data reading or the like due to leakage current.

An embodiment of the present invention is a semiconductor memory device comprising a bit line; a word line; a memory cell placed in an intersection portion of the bit line and the word line; and a reading circuit electrically connected to the bit line. The memory cell comprises a first transistor and an antifuse. A gate of the first transistor is electrically connected to the word line, one of a source and a drain of the first transistor is electrically connected to the bit line, and the other of the source and the drain of the first transistor is electrically connected to one electrode of the antifuse. The reading circuit comprises a pre-charge circuit, a clocked inverter, and a switch. The pre-charge circuit includes a second transistor and a NAND circuit. A gate of the second transistor is electrically connected to an output terminal of the NAND circuit, one of a source and a drain of the second transistor is electrically connected to a power supply line, and the other of the source and the drain of the second transistor is electrically connected to one terminal of the switch. One input terminal of the NAND circuit is electrically connected to an address signal line and the other input terminal of the NAND circuit is electrically connected to a pre-charge signal line. An input terminal of the clocked inverter is electrically connected to the other of the source and the drain of the second transistor and one terminal of the switch, and an output terminal of the clocked inverter is electrically connected to an output signal line. The other terminal of the switch is electrically connected to the bit line. A channel formation region of the first transistor and a channel formation region of the second transistor each include an oxide semiconductor.

In the above structure, the bit line is pre-charged by the pre-charge circuit before performing reading operation of the memory cell.

An embodiment of the present invention is a semiconductor memory device comprising an m bit line (m is an integer of 1 or more), an n word line (n is an integer of 1 or more), a (m×n) memory cell placed in an intersection portion of the m bit line and the n word line, and an m reading circuit electrically connected to the m bit line. The (m×n) memory cell comprises a first transistor and an antifuse. A gate of the first transistor is electrically connected to the word line, one of a source and a drain of the first transistor is electrically connected to the bit line, and the other of the source and the drain of the first transistor is electrically connected to one electrode of the antifuse. The m reading circuit comprises a pre-charge circuit, a switch, and a latch circuit that is common to the m reading circuit. The pre-charge circuit comprises a second transistor and a NAND circuit. A gate of the second transistor is electrically connected to an output terminal of the NAND circuit, one of a source and a drain of the second transistor is electrically connected to a power supply line, and the other of the source and the drain of the second transistor is electrically connected to one terminal of the switch. One input terminal of the NAND circuit is electrically connected to an address signal line and the other input terminal of the NAND circuit is electrically connected to a pre-charge signal line. An input terminal of the latch circuit is electrically connected to the other of the source and the drain of the second transistor and one terminal of the switch, and an output terminal of the latch circuit is electrically connected to an output signal line. The other terminal of the switch is electrically connected to the bit line. A channel formation region of the first transistor and a channel formation region of the second transistor each include an oxide semiconductor.

In the above structure, reading of an n memory cell electrically connected to the same word line that is included in the n word line is performed at the same time. In other words, reading operation can be performed in a parallel mode.

In the above structure, the m bit line is pre-charged by the pre-charge circuit included in the m reading circuit before performing reading operation.

In any of the above structures, the bit line is pre-charged with a power supply potential input from the power supply line by the pre-charge circuit.

An embodiment of the present invention can be a semiconductor device including the semiconductor memory device with any of the above structures.

Note that in this specification and the like, the term of "electrode" or "wiring" does not limit the function of components. For example, an "electrode" is sometimes used as part of a "wiring", and vice versa. Furthermore, the term "electrode" or "wiring" can include the case where a plurality of "electrodes" or a plurality of "wirings" is formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. Here, there is no particular limitation on an object having any electric function as long as electric signals can be transmitted and received between components that are connected to each other through the object. Examples of an "object having any electric function" are a switching element such as a transistor, a resistor, an inductor, a capacitor, and an element with a variety of functions as well as an electrode and a wiring.

In addition, in this specification, ordinal numbers such as "first", "second", and "third" are used in order to avoid confusion among components, and the terms do not limit the components numerically.

According to an embodiment of the present invention, a semiconductor memory device or a semiconductor device which has high reading accuracy can be provided. In addition, according to an embodiment of the present invention, a semiconductor memory device or a semiconductor device can be downsized.

BEST MODE FOR CARRYING OUT THE INVENTION

Hereinafter, the embodiments of the present invention will be described with reference to the accompanying drawings. Note that the present invention is not limited to the following description, and those skilled in the art can easily understand that modes and details of the present invention can be changed in various ways without departing from the purpose and the scope of the invention. Therefore, the present invention should not be construed as being limited to the following description of the embodiments.

[Embodiment 1]

In this embodiment, a semiconductor memory device including an antifuse will be described. The semiconductor memory device described in this embodiment also functions as part of an RFID tag.

Figure 1:
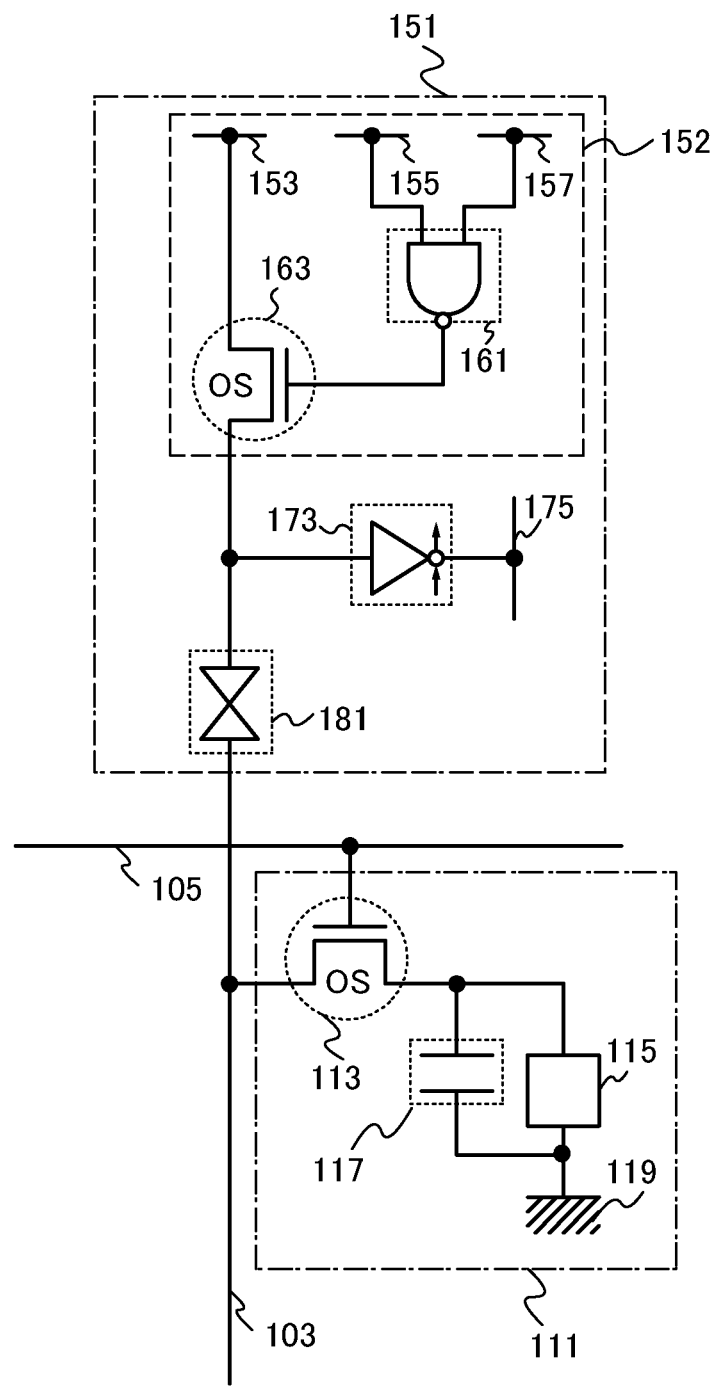
FIG. 1 illustrates a circuit configuration of a memory cell and a reading circuit.

A main circuit configuration of a semiconductor memory device according to this embodiment will be described. FIG. 1 illustrates the structures of a memory cell 111 and a reading circuit 151. Note that FIG. 1 illustrates one memory cell 111 and one reading circuit 151, but the number of memory cells 111 and the number of reading circuits 151 are each not limited to one. In addition, a writing circuit is not shown in the semiconductor memory device according to this embodiment, but a writing circuit or the like may be provided as appropriate.

The memory cell 111 is placed in an intersection portion of a bit line 103 and a word line 105. The bit line 103 intersects the word line 105. The memory cell 111 includes a first transistor 113 and an antifuse 115. In addition, a capacitor 117 is provided in the memory cell 111 but is not necessarily provided.

In the memory cell 111, an oxide semiconductor is used in a channel formation region of the first transistor 113. A gate of the first transistor 113 is electrically connected to the word line 105, one of a source and a drain of the first transistor 113 is electrically connected to the bit line 103, and the other of the source and the drain of the first transistor 113 is electrically connected to one electrode of the antifuse 115.

A ground potential 119 (GND) is applied to the other electrode of the antifuse 115. In the case of providing the capacitor 117 in the memory cell 111, one electrode of the capacitor 117 is electrically connected to the other of the source and the drain of the first transistor 113 and one electrode of the antifuse 115. The other electrode of the capacitor 117 is electrically connected to the other electrode of the antifuse 115 to be applied with the ground potential 119. The capacitor 117 functions as an assist capacitor for supplying the antifuse 115 with power for performing writing operation.

The reading circuit 151 is placed to be electrically connected to the bit line 103. The reading circuit 151 includes a pre-charge circuit 152, a clocked inverter 173, and a switch 181. The switch 181 is placed between the memory cell 111, and the clocked inverter 173 and the pre-charge circuit 152.

The pre-charge circuit 152 includes a second transistor 163 and a NAND circuit 161. An oxide semiconductor is used in a channel formation region of the second transistor 163.

A gate of the second transistor 163 is electrically connected to an output terminal of the NAND circuit 161, one of a source and a drain of the second transistor 163 is electrically connected to a first wiring 153, and the other of the source and the drain of the second transistor 163 is electrically connected to one terminal of the switch 181. One input terminal of the NAND circuit 161 is electrically connected to a second wiring 155, the other input terminal of the NAND circuit 161 is electrically connected to a third wiring 157, and the output terminal of the NAND circuit 161 is electrically connected to the gate of the second transistor 163.

A power supply potential (VDD) is input to the first wiring 153. Therefore, the first wiring 153 has a function of a power supply line. An address signal is input to the second wiring 155. Therefore, the second wiring 155 has a function of an address signal line. A pre-charge signal is input to the third wiring 157. Therefore, the third wiring 157 has a function of a pre-charge signal line.

An input terminal of the clocked inverter 173 is electrically connected to one terminal of the switch 181 and the other of the source and the drain of the second transistor 163 in the pre-charge circuit 152. An output terminal of the clocked inverter 173 is electrically connected to a fourth wiring 175. Data stored in the memory cell 111, i.e., an output signal having a potential which reflects the resistance state of the antifuse 115 is input to the fourth wiring 175. Therefore, the fourth wiring has a function of an output signal line.

One terminal of the switch 181 is electrically connected to the input terminal of the clocked inverter 173 and the other of the source and the drain of the second transistor 163 in the pre-charge circuit 152. The other terminal of the switch 181 is electrically connected to the bit line 103. In addition, the other terminal of the switch 181 is electrically connected to one of the source and the drain of the first transistor 113 in the memory cell 111 through the bit line 103.

Figure 2:
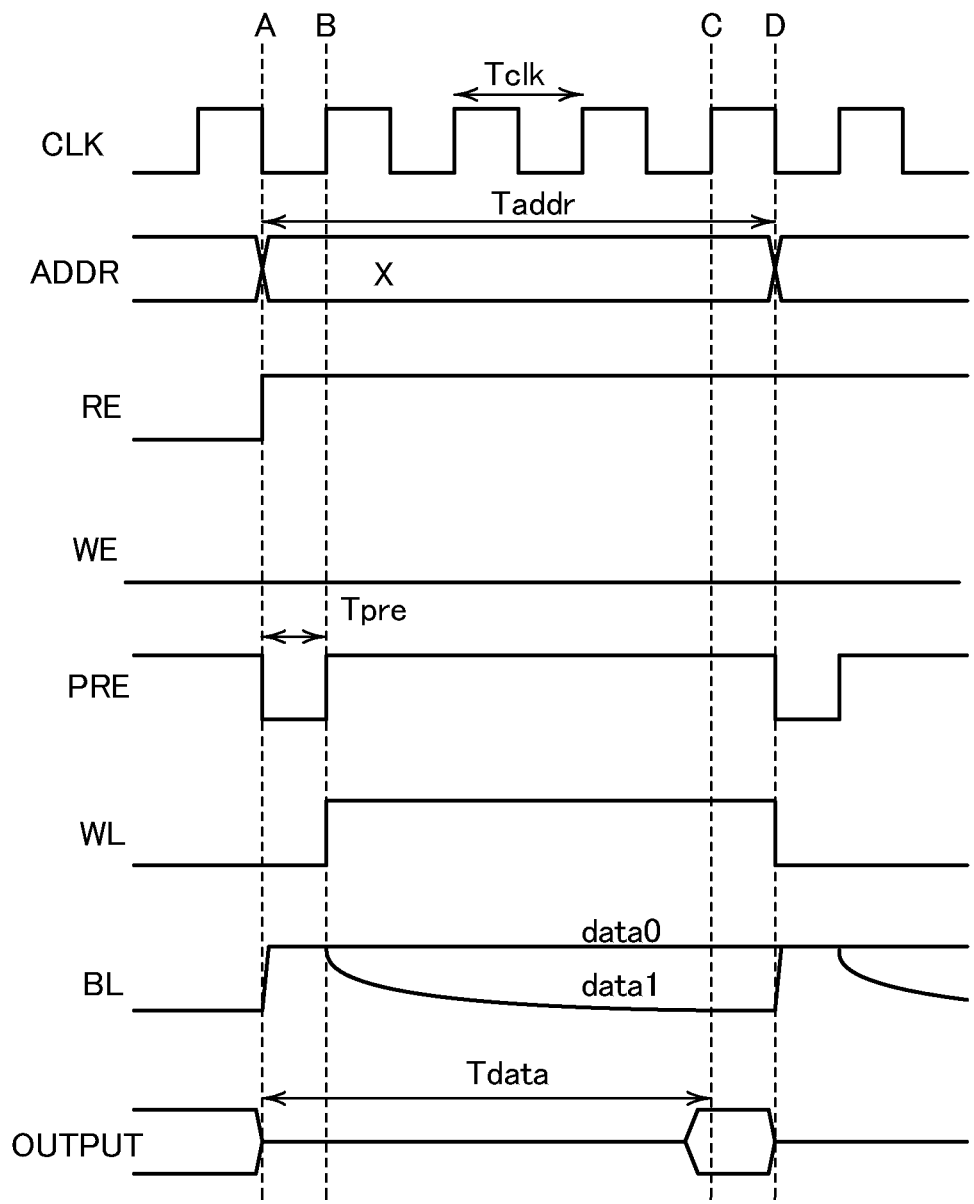
FIG. 2 is a timing chart showing reading operation.

The operation of the circuit illustrated in FIG. 1 will be described with reference to a timing chart illustrated in FIG. 2. FIG. 2 is a timing chart showing reading operation of the circuit illustrated in FIG. 1.

Operation in the semiconductor memory device is performed in synchronization with rising or falling of a clock signal (CLK). Note that the clock signal (CLK) is input to the clocked inverter 173. A memory cell targeted for access is specified by an address signal (ADDR). FIG. 2 illustrates an example in which access to a memory cell specified by the address signal (ADDR)=X (X is arbitrary) is performed. Reading operation is performed on the memory call specified by the address signal. Reading operation is performed when a read enable signal (RE) is at a high potential. Writing operation is performed when a write enable signal (WE) is at a high potential. Writing operation or reading operation can be selectively performed by switching a writing circuit (not shown in FIG. 1) and the reading circuit 151 by the read enable signal (RE) and the write enable signal (WE). The timing chart in FIG. 2 shows only the case where reading operation is performed with the use of the reading circuit 151 when the read enable signal (RE) is set at a high potential and the write enable signal (WE) is set at a low potential. Before the reading operation, pre-charge operation is performed when a pre-charge signal (PRE) is at a low potential.

In FIG. 2, a period AD is a period in which access to a given memory cell (that is described as the memory cell 111 here) is performed in order to perform the reading operation. The reading operation is performed by setting the read enable signal (RE) at a high potential. In addition, in the period AD, the switch 181 is turned on and the address signal (ADDR) is active (at a high potential).

A period AB is a pre-charge period in which pre-charge operation is performed to charge the bit line 103. In the period AB, the pre-charge signal (PRE) is set at a low potential and the output terminal of the NAND circuit 161 in the pre-charge circuit 152 of FIG. 1 is set at a high potential, whereby the second transistor 163 is turned on. In the period AB, since the switch 181 is turned on, the bit line 103 (BL) is charged by the potential input by the first wiring 153 (VDD). Note that in the period AB, in order to turn off the first transistor 113, the word line 105 (WL) is set at a low potential.

A period BD is a reading period in which an output signal (OUTPUT) having a potential which reflects data is output to the fourth wiring 175 by performing reading operation. In the period BD, in order to turn on the first transistor 113, the word line 105 is set at a high potential. The potential of the bit line 103 is discharged in accordance with the resistance state (resistance value) of the antifuse 115. Therefore, unless the antifuse 115 is short-circuited (i.e., when the antifuse 115 is in a high resistance state), the potential of the bit line 103 is kept. On the other hand, when the antifuse 115 is short-circuited (i.e., when the antifuse 115 is in a low resistance state), the potential of the bit line 103 is getting lower. As an example of change of the potential of the bit line 103 (BL), FIG. 2 schematically shows that when the memory cell 111 holds data "0", the potential of the bit line 103 is kept (data0), and when the memory cell 111 holds data "1", the potential of the bit line 103 is getting lower (data1).

Note that in a point B, the output terminal of the NAND circuit 161 is set at a low potential by setting the pre-charge signal at a high potential, and the second transistor 163 is turned off, whereby the pre-charge operation is stopped.

In the period BD, a period BC is needed for determining the potential of the bit line 103 and a period CD is a period in which an output signal which is output to the fourth wiring 175 is determined from the potential of the bit line 103. The potential of the bit line 103 is input to the input terminal of the clocked inverter 173. Then, the output signal (OUTPUT) having the potential which reflects the resistance state of the antifuse 115 (the potential of the bit line 103) is output from the output terminal of the clocked inverter 173 to the fourth wiring 175.

An oxide semiconductor is used in a channel formation region of the first transistor 113 of the memory cell 111 in FIG. 1. By using an oxide semiconductor in the channel formation region, off current of the first transistor 113 can be sufficiently reduced. Accordingly, when the pre-charge operation is performed, leakage of the potential of the bit line 103 through the first transistor 113 can be prevented.

Here, a time for reading operation of an RFID is regulated by a standard. It is necessary that the pre-charge operation be performed within a time which can be used for reading operation; therefore, there is a possibility that enough time for reading data actually cannot be obtained if the pre-charge period is prolonged.

Thus, according to this embodiment, the first transistor 113 in which an oxide semiconductor is used in the channel formation region is used. Accordingly, since the off current of the first transistor 113 is sufficiently small, leakage of the potential of the bit line 103 through the first transistor 113 can be prevented during the pre-charge operation. As a result, after the pre-charge period, a sufficient data reading period can be secured, which can lead to improvement in reading accuracy.

In FIG. 2, Tclk indicates one cycle period of the clock signal, Taddr indicates a period in which access to a targeted memory cell is performed, Tpre indicates a period in which the pre-charge is performed, and Tdata indicates a period before data is determined (before the potential of the bit line is determined).

For example, times for reading operation used for one bit are as follows based on ISO15693: Tclk is 18.88 µs, Taddr is 37.76 µs, Tpre is 9.44 µs, and Tdata is 28.32 µs. In addition, times for reading operation of one bit are as follows based on NFC-Forum-Type3, which is very short as compared to that based on ISO15693: Tclk: 2.36 µs, Taddr: 4.72 µs, Tpre: 1.18 µs, and Tdata: 4.72 µs.

As described above, when there is a time regulation by a standard, the leakage current can have great influence on the whole of the semiconductor memory device even though the leakage current is small for individual structures. For example, a time spent for the pre-charge operation is very short on the basis of NFC-Forum-Type3. Therefore, leakage of the potential of the bit line during the pre-charge period might lead to a situation in which pre-charge is not completed within the time limit. In addition, if the pre-charge period is prolonged, there is a possibility that a sufficient data reading period cannot be secured.

As in this embodiment, with the first transistor 113 having small off current, leakage of the potential of the bit line can be prevented during the pre-charge period, which enables shortening of the pre-charge period. As a result, a sufficient data reading period can be secured and reading accuracy can be improved.

Further, in the reading period, the potential of the bit line 103 is discharged in accordance with the resistance state of the antifuse 115. The potential of the bit line 103 is kept when the antifuse 115 is not short-circuited (in a high resistance state), and getting lower when the antifuse 115 is short-circuited (in a low resistance state). The output signal has the potential which reflects the potential of the bit line 103.

As in this embodiment, the small off current of the second transistor 163 can prevent change in the potential of the bit line during reading operation or difficulty in detecting the potential of the bit line due to leakage current of the second transistor 163 in the reading period. Thus, incorrect data reading caused by leakage current can be prevented, so that data reading accuracy can be improved.

Figure 3:
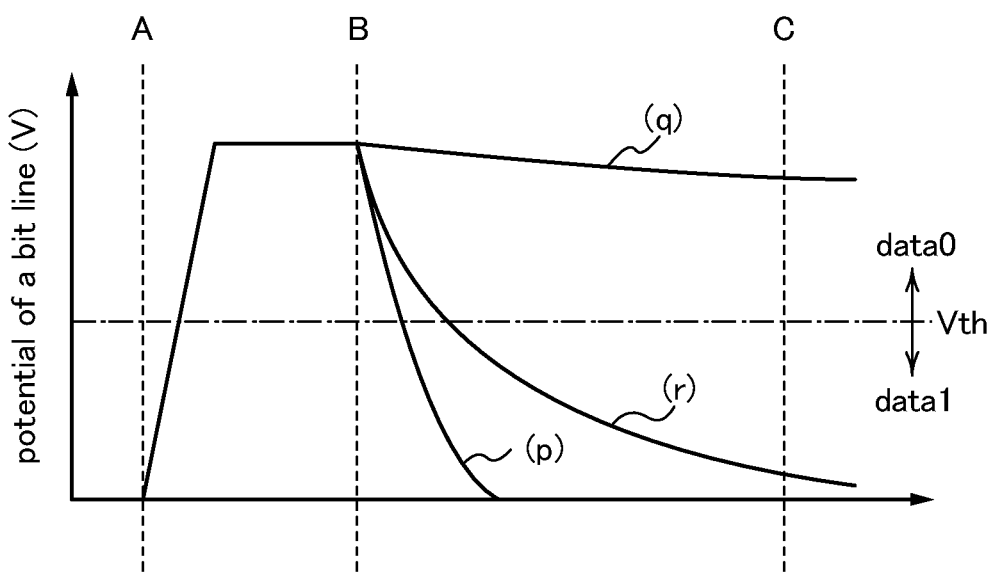
FIG. 3 is a schematic diagram showing change of the potential of a bit line.

In addition, FIG. 3 schematically shows a state of change in the potential of the bit line 103 when the semiconductor memory device operates in accordance with the timing chart shown in FIG. 2. In FIG. 3, (p) shows the case where the antifuse 115 is short-circuited and resistance is sufficiently lowered (a low resistance state), (q) shows the case where the antifuse 115 is not short-circuited (a high resistance state), and (r) shows the state where the antifuse 115 is not completely short-circuited and resistance is not sufficiently lowered as compared to (p).

In the case of (p), the potential of the bit line is rapidly lowered after the point B, and the potential of the bit line at a point C is equal or nearly equal to the value of GND. Then, the data1 is output in accordance with the potential of the bit line in the period CD.

In the case of (q), the potential of the bit line is hardly lowered even after the point B, and the potential of the bit line at the point C is nearly equal to the value of VDD. Then, the data0 is output in accordance with the potential of the bit line in the period CD.

In the case of (r), after the point B, the potential of the bit line is lowered at a slower rate than the potential of the bit line in case of (p). Therefore, when the point C is set too close to the point B, there is a possibility that the potential of the bit line cannot be lowered sufficiently and cannot be output as the data1.

However, even in the case of (r), when the reading period which is long enough can be secured, the point C can be set to a point at which the potential of the bit line is lowered to a desired value. Then, the data1 can be output. Accordingly, as in this embodiment, when the pre-charge period can be shortened and the reading period after the pre-charge period can be sufficiently secured, data of a memory cell including an antifuse which is not completely short-circuited as in the case of (r) can be read, so that reading accuracy can be improved.

In this manner, in the semiconductor memory device according to this embodiment, a transistor having sufficiently low off current is used as a transistor included in a memory cell and a transistor in a reading circuit, and leakage current influencing reading operation including pre-charge operation can be removed as much as possible, whereby data reading accuracy can be improved.

Note that the structure described in this embodiment can be combined as appropriate with any structure described in the other embodiments in this specification.

[Embodiment 2]

In this embodiment, transistors which can be used as the transistor having sufficiently small off current described in Embodiment 1 will be described. Cross-sectional schematic views of transistors according to this embodiment are illustrated in FIGS. 4A to 4C.

Figure 4A:
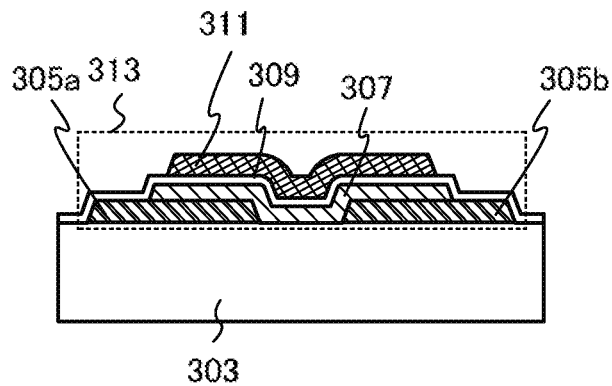
FIGS. 4A to 4C are diagrams of cross-sections of transistors.
Figure 4B:
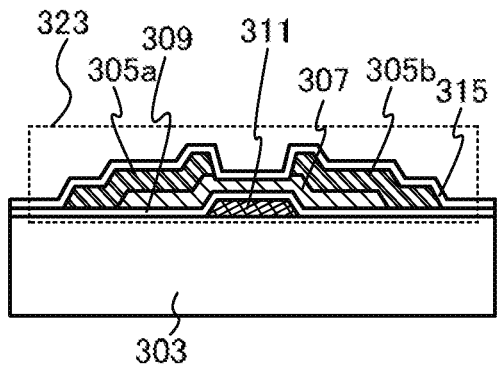
Figure 4C:
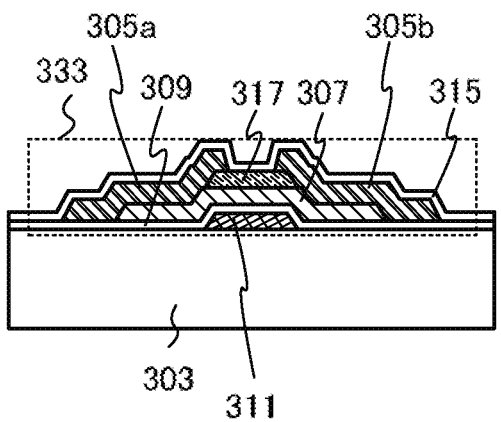

A transistor 313 illustrated in FIG. 4A includes a pair of conductive layers 305a and 305b functioning as source and drain electrodes provided over an insulating surface 303, a semiconductor layer 307 provided over the conductive layers 305a and 305b, a gate insulating layer 309 provided over the semiconductor layer 307, and a gate electrode 311 provided over the gate insulating layer 309.

The transistor 313 illustrated in FIG. 4A is a top-gate transistor in which the gate electrode 311 is provided above the semiconductor layer 307. Further, the transistor 313 is a bottom-contact transistor in which the conductive layers 305a and 305b functioning as the source and drain electrodes are provided below the semiconductor layer 307. Note that the transistor 313 may be a top-contact transistor in which the conductive layers 305a and 305b are provided over the semiconductor layer 307.

The semiconductor layer 307 can be formed using any of the following oxide semiconductors: an oxide of four metal elements such as an In—Sn—Ga—Zn—O-based oxide semiconductor; oxides of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; oxides of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; an In—O-based oxide semiconductor; a Sn—O-based oxide semiconductor; and a Zn—O-based oxide semiconductor. Here, for example, an In—Ga—Zn—O-based oxide semiconductor is an oxide including at least In, Ga, and Zn, and there is no particular limitation on the composition ratio thereof. The In—Ga—Zn—O-based oxide semiconductor may contain an element other than In, Ga, and Zn. Further, $SiO_2$ may be contained in the above oxide semiconductor.

The semiconductor layer 307 can be formed using an oxide semiconductor represented by the chemical formula, $InMO_3(ZnO)_m$ (m>0). Here, M denotes one or more of metal elements selected from Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn—O-based oxide semiconductor which has an atomic ratio of In:Zn:O=X:Y:Z, the relation of Z>1.5X+Y is satisfied.

The semiconductor layer 307 is preferably formed by a sputtering method. For example, with the use of a target of any of the above oxides, the semiconductor layer 307 can be formed by a sputtering method.

Here, when the purity of the target is set to 99.99% or higher, alkali metal, hydrogen atoms, hydrogen molecules, water, a hydroxyl group, hydride, or the like mixed to the semiconductor layer 307 including an oxide semiconductor can be reduced. In addition, when the target is used, the concentration of alkali metal such as lithium, sodium, or potassium can be reduced in the semiconductor layer 307 including an oxide semiconductor.

In addition, at the formation of the semiconductor layer 307 including an oxide semiconductor, the pressure of a treatment chamber in a sputtering apparatus is set to 0.4 Pa or less, whereby mixing of an impurity such as alkali metal or hydrogen to an object or a surface of the object can be suppressed. Note that hydrogen may be contained in the object as a hydrogen molecule, water, a hydroxyl group, or hydride in some cases in addition to a hydrogen atom.

Further, with the use of an entrapment vacuum pump (e.g., a cryopump) as an evacuation system of the chamber of the sputtering apparatus, counter flow of impurities such as alkali metal, a hydrogen atom, a hydrogen molecule, water, a hydroxyl group, or hydride from the evacuation system can be reduced. An evacuation unit may be a turbo pump provided with a cold trap.

After the semiconductor layer 307 including an oxide semiconductor is formed, if necessary, heat treatment may be performed in an atmosphere which hardly contains hydrogen and moisture (a nitrogen atmosphere, an oxygen atmosphere, a dry-air atmosphere (for example, as for moisture, a dew point is lower than or equal to −40° C., preferably lower than or equal to −60° C.), or the like) at a temperature higher than or equal to 200° C. and lower than or equal to 450° C. The heat treatment can be called dehydration or dehydrogenation, which is for detaching H, OH, or the like from the semiconductor layer 307 including an oxide semiconductor. In the case where temperature is raised in an inert atmosphere, and the atmosphere is switched to an atmosphere containing oxygen during heat treatment, or in the case where an oxygen atmosphere is employed, the heat treatment can also be called additional oxidation treatment.

In addition, as an oxide semiconductor used for the semiconductor layer 307, an i-type (intrinsic) oxide semiconductor or a substantially i-type (intrinsic) oxide semiconductor which is obtained in the following manner can be used: hydrogen, which is an n-type impurity, is removed from an oxide semiconductor, and the oxide semiconductor is highly purified so as to contain as few impurities that are not main components of the oxide semiconductor as possible. In other words, a highly purified i-type (intrinsic) semiconductor, or a semiconductor close thereto, is obtained not by adding an impurity but by removing an impurity such as hydrogen or water as much as possible. Thus, the oxide semiconductor layer included in the transistor 313 can be an electrically i-type (intrinsic) oxide semiconductor layer which highly purified Note that the number of carriers in the highly purified oxide semiconductor is very small (close to zero), and the carrier concentration is less than $1\times10^{14}/cm^3$, preferably less than $1\times10^{12}/cm^3$, further preferably less than $1\times10^{11}/cm^3$.

Since the oxide semiconductor includes extremely few carriers, off current can be reduced in the transistor. Considering that the transistor 313 is included in the semiconductor memory device of Embodiment 1, it is preferable that the off current of the transistor 313 be as small as possible.

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1\times10^{18}/cm^3$, preferably less than or equal to $1\times10^{17}/cm^3$, the concentration of the above impurity is preferably reduced. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Specifically, in the transistor including the highly purified oxide semiconductor, a current value in an off state (off current value) can be lowered to a value less than or equal to 10 aA/μm ($1\times10^{-17}$ A/μm), further less than or equal to 1 aA/μm ($1\times10^{-18}$ A/μm), or still further less than or equal to 10 zA/μm ($1 \times 10^{-20}$ A/μm). Further, in the transistor including the highly purified oxide semiconductor, the current value in an off state (off current value) can be lowered to a value less than or equal to 100 yA/μm ($1 \times 10^{-22}$ A/μm), preferably less than or equal to 10 yA/μm ($1 \times 10^{-23}$ A/μm), more preferably less than or equal to 1 yA/μm ($1 \times 10^{-24}$ A/μm).

In addition, the semiconductor layer 307 including an oxide semiconductor may be an oxide semiconductor having weak p-type conductivity by doping of the semiconductor layer 307 including an oxide semiconductor with an impurity imparting p-type conductivity, such as Sn, so that off current is reduced.

When the transistor including the highly purified oxide semiconductor is used as the first transistor 113 and the second transistor 163 of Embodiment 1, off current can be extremely small. Accordingly, reading accuracy of the semiconductor memory device can be further improved.

For example, as the insulating surface 303, a structure in which an insulating layer is provided over a substrate is employed. There is no limitation on the substrate as long as it has a resistance for manufacturing steps performed later. As examples of the substrate, an insulating substrate such as a glass substrate, a semiconductor substrate such as a silicon substrate, a conductive substrate such as a metal substrate, a flexible substrate such as a plastic substrate, and the like can be given. The insulating layer serves as a base for preventing dispersion of impurities from the substrate. For example, the insulating layer serving as a base is formed with a single-layer structure using any of insulating layers of silicon oxide, silicon oxynitride, silicon nitride, hafnium oxide, aluminum oxide, tantalum oxide, and the like or a layered structure including two or more layers selected from these layers. Note that the insulating layer preferably contains hydrogen or water as little as possible.

The conductive layers 305a and 305b are formed using a metal material selected from titanium, aluminum, tungsten, chromium, copper, tantalum, molybdenum, and the like; an alloy material including any of these metal materials as its component; or the like. In addition, the conductive layers 305a and 305b can be formed using a material selected from manganese, magnesium, zirconium, and beryllium. Further, the conductive layers 305a and 305b can be formed using a material which is obtained in such a manner that one or a plurality of elements selected from titanium, tantalum, tungsten, molybdenum, chromium, neodymium, and scandium is added to aluminum. For example, a Cu—Mg—Al alloy can be used. Note that the conductive layers 305a and 305b can be formed to have a single layer structure or a layered structure including two or more layers. For example, a layered structure of a layer including a Cu—Mg—Al alloy and a layer including Cu can be employed.

The gate insulating layer 309 is formed with a single-layer structure using any of insulating layers of silicon oxide, silicon nitride, silicon oxynitride, aluminum oxide, aluminum nitride, aluminum oxynitride, hafnium oxide, and the like; or a layered structure including two or more layers selected from these insulating layers. Note that the gate insulating layer 309 preferably contains hydrogen or water as little as possible.

The gate electrode 311 can be formed with a single-layer structure or a layered structure including two or more layers using a metal material selected from molybdenum, titanium, chromium, tantalum, tungsten, aluminum, copper, neodymium, scandium, and the like; an alloy material including any of these metal materials as its main component; or a nitride (metal nitride) of any of these metal materials. For example, a Cu—Mg—Al alloy can be used. For example, a layered structure of a layer including a Cu—Mg—Al alloy and a layer including Cu can be employed. The gate electrode 311 is formed to overlap with the semiconductor layer 307 with the gate insulating layer 309 provided therebetween.

A transistor 323 illustrated in FIG. 4B includes the gate electrode 311 provided over the insulating surface 303, the gate insulating layer 309 provided to cover the gate electrode 311, the semiconductor layer 307 provided over the gate insulating layer 309, and the pair of conductive layers 305a and the 305b provided over the semiconductor layer 307. In addition, a passivation layer 315 is provided to cover the transistor 323.

The passivation layer 315 can be formed using a material such as silicon oxide, silicon oxynitride, silicon nitride, hafnium oxide, aluminum oxide, tantalum oxide, or the like. Note that whether or not an insulating layer such as a passivation layer is formed over the transistor 323, the number of layers stacked in the insulating layer, the thickness of the insulating layer, and the like can be determined appropriately in accordance with usage of the transistor, or the like.

The transistor 323 is a bottom-gate transistor in which the semiconductor layer 307 is provided over the gate electrode 311. In addition, the transistor 323 is a top-contact transistor in which the conductive layers 305a and the 305b functioning as source and drain electrodes are provided over the semiconductor layer 307. In addition, the transistor 323 is a channel-etched transistor in which part of the semiconductor layer 307 between the conductive layer 305a and the conductive layer 305b is etched. Note that the transistor 323 may be a bottom-contact transistor in which the conductive layers 305a and 305b are provided below the semiconductor layer 307.

A transistor 333 illustrated in FIG. 4C includes a channel protective layer 317 provided over the semiconductor layer 307, in addition to the structure of the transistor 323 illustrated in FIG. 4B. The transistor 333 includes the gate electrode 311 provided over the insulating surface 303, the gate insulating layer 309 provided to cover the gate electrode 311, the semiconductor layer 307 provided over the gate insulating layer 309, the channel protective layer 317 which is provided in a region overlapping with the gate electrode 311 and over the semiconductor layer 307, and the pair of conductive layers 305a and the 305b provided over the semiconductor layer 307. In addition, a passivation layer 315 is provided to cover the transistor 333.

By providing the channel protective layer 317, damage to a region serving as a channel formation region of the semiconductor layer 307 in a later step (damage due to plasma, reduction in thickness due to an etchant, or the like in etching) can be prevented in the transistor 333.

Any of the transistor 313, the transistor 323, and the transistor 333 illustrated in FIGS. 4A to 4C, in which the semiconductor layer 307 including an oxide semiconductor serves as a channel formation region, can be used as the transistors in the structure of Embodiment 1. As in this embodiment, by forming the semiconductor layer 307 with the use of an oxide semiconductor, a transistor having sufficiently small off current can be provided. This enables improvement in reading accuracy of a semiconductor memory device or a semiconductor device.

Note that the structure described in this embodiment can be combined as appropriate with any structure described in the other embodiments in this specification.

[Embodiment 3]

In this embodiment, a semiconductor memory device including a memory cell array in which memory cells are arranged in a matrix and a reading circuit will be described with reference to FIG. 5. Note that the same reference numerals denote the same parts as in FIG. 1 of Embodiment 1, and a detailed description is omitted.

Figure 5:
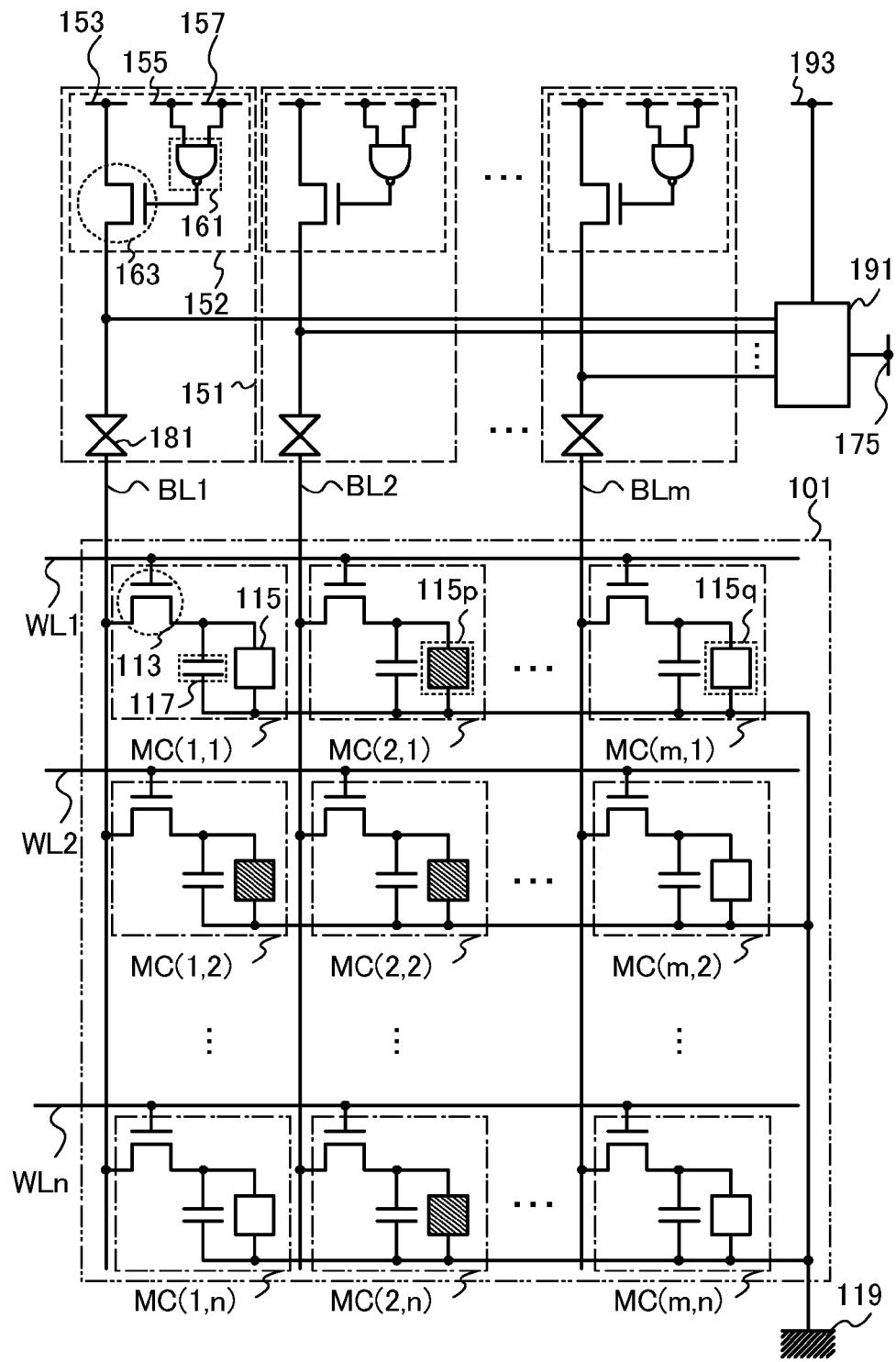
FIG. 5 illustrates a circuit configuration of a memory cell array and a reading circuit.

FIG. 5 illustrates structures of a memory cell array 101 and reading circuits 151. Note that a writing circuit or the like may be provided as appropriate in the semiconductor memory device according to this embodiment.

The memory cell array 101 includes (m×n) memory cells MC (x, y). Each memory cell MC (x, y) is provided in an intersection portion of a bit line BLx and a word line WLy. Note that m is an integer of 1 or more, n is an integer of 1 or more, x is an integer more than or equal to 1 and less than or equal to m, and y is an integer more than or equal to 1 and less than or equal to n.

The memory cell MC (x, y) corresponds to the memory cell 111 in FIG. 1. The bit line BLx corresponds to the bit line 103 in FIG. 1. The word line WLy corresponds to the word line 105 in FIG. 1. Here, the memory cell array includes m bit lines BLx and n word lines WLy.

Note that in FIG. 5, an antifuse 115 which is short-circuited (in a low resistance state) is represented as an antifuse 115$p$ and an antifuse 115 which is not short-circuited (in a high resistance state) is represented as an antifuse 115$q$.

The reading circuits 151 are provided to be electrically connected to the bit lines BLx. In FIG. 5, m bit lines BLx are arranged, and the reading circuit 151 is provided for each of the m bit lines BLx.

Note that instead of the clocked inverter 173 in FIG. 1, a latch circuit 191 is provided for the reading circuits 151 in this embodiment. The latch circuit 191 is common to all the reading circuits 151.

An input terminal of the latch circuit 191 is electrically connected to one electrode of the switch 181 and the other of the source and the drain of the second transistor 163 of each of the reading circuits 151, and an output terminal of the latch circuit 191 is electrically connected to the fourth wiring 175. The other input terminal of the latch circuit 191 is electrically connected to a fifth wiring 193. A latch signal is input to the fifth wiring 193. Therefore, the fifth wiring 193 has a function of a latch signal line. When the latch signal is at a high potential, an output signal is output from the latch circuit 191 to the fourth wiring 175.

The semiconductor memory device according to this embodiment is capable of reading data in a parallel mode. Data reading in a parallel mode will be described using FIG. 5 and FIG. 6.

Figure 6:
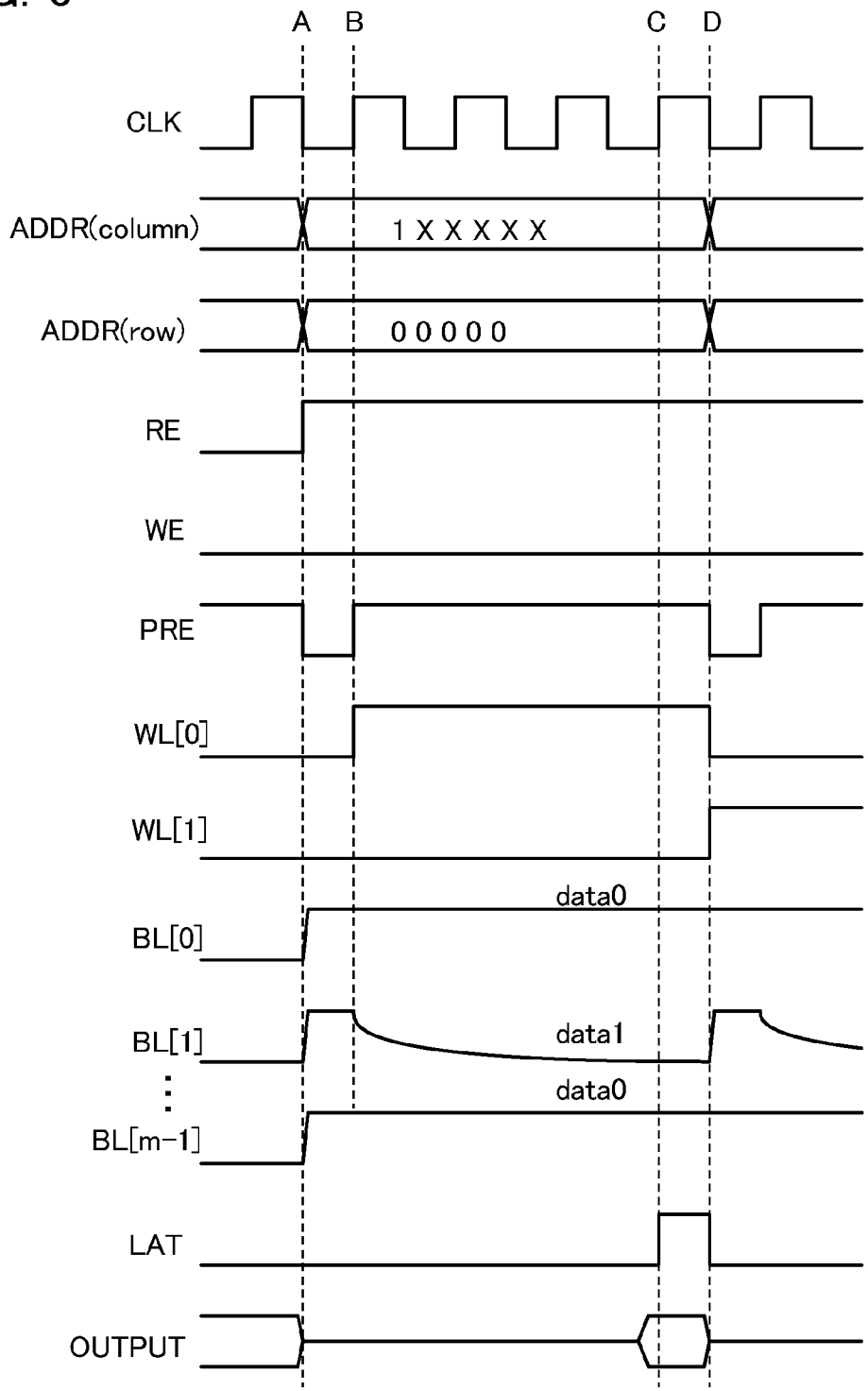
FIG. 6 is a timing chart showing reading operation in a parallel mode.

In FIG. 6, in a similar manner to description for FIG. 2, operation of the semiconductor memory device is performed in synchronization with rising or falling of a clock signal (CLK). A memory cell targeted for access is specified by address signals ADDR(row) and ADDR(column).

The address signals are divided into an address signal ADDR(row) which specifies a row decoder and an address signal ADDR(column) which specifies a column decoder. Only one row decoder is specified consistently in accordance with a combination in the address signal ADDR(row). One or all of the column decoders are specified in accordance with a combination in the address signal ADDR(column). In the case where data is read in a serial mode, reading operation is performed by specifying one column decoder, and in the case where data is read in a parallel mode, reading operation is performed by specifying all of the column decoders.

In FIG. 6, the address signal ADDR(row), which specifies a row decoder, includes a plurality of signals, and only one row decoder which is to drive is selected in accordance with a combination of signals. For example, in the case where there are 32 word lines WL (n=32) and a 5-bit address is obtained, WL[0] is selected by ADDR(row)=00000, and WL[31] is selected by ADDR(row)=11111. Note that WL[y−1] corresponds to the word line WLy of FIG. 5. In other words, WL[0] corresponds to the word line WL1 of FIG. 5.

In addition, in FIG. 6, the address signal ADDR(column), which specifies a column decoder, includes a plurality of signals, and one or all of the column decoders which are to drive are selected in accordance with a combination of signals. For example, in the case where there are 32 bit lines BL (m=32) and a 6-bit address is obtained, BL[0] is selected by ADDR(column)=000000, BL[31] is selected by ADDR(column)=011111, and all of the bits are selected by ADDR(column)=1XXXXX (each X is arbitrary). Note that BL[x−1] corresponds to the bit line BLx of FIG. 5. That is, BL[0] corresponds to the bit line BL1 of FIG. 5.

In FIG. 6, an example in which memory cells MC(x, 1) in a first row in FIG. 5 are selected and reading operation is performed in a parallel mode is described. Therefore, ADDR(row)=00000 and ADDR(column)=1XXXXX are active (at a high potential) in the period AD. The reading operation is performed by setting read enable signal (RE) at a high potential. In addition, the switch 181 is turned on during the period AD.

In the period AB that is a pre-charge period, the pre-charge signal (PRE) is set at a low potential and the output terminal of the NAND circuit 161 in the pre-charge circuit 152 of FIG. 5 is set at a high potential. Therefore, the second transistor 163 is turned on. In the period AB, since the switch 181 is turned on, the bit line BLx is charged by a potential (VDD) input to the first wiring 153. Here, since reading operation is performed in a parallel mode, m bit lines BLx are charged with VDD by the respective reading circuits 151. Note that in the period AB, the first transistors 113 of all of the memory cells MC(x, y), which includes the memory cell MC(x, 1) in the first row, are turned off. Therefore, all of the word lines WLn, which includes the word line WL1 in the first row, are set at a low potential.

In the period BD that is a reading period, reading operation is performed, and an output signal (OUTPUT) having a potential which reflects data stored in the memory cell MC(x, 1) (a resistance state of the antifuse 115), i.e., the output signal (OUTPUT) having a potential which reflects the potential of the bit line BLx is output to the fourth wiring 175. In the period BD, in order to turn on the first transistors 113 of the memory cells MC(x, 1) in the first row, the word line WL1 (WL[0]) is set at a high potential. At this time, the potential of the bit line BLx (each of BL[0] to BL[m−1]) is discharged in accordance with the resistance state of the antifuse 115.

FIG. 5 shows an example in which an antifuse 115$p$ of a memory cell MC(2, 1) is short-circuited and of an antifuse 115 of the memory cell MC(1, 1) and an antifuse 115$q$ of the memory cell MC(m, 1) are not short-circuited. Therefore, in FIG. 6, the potential of BL[1] is getting lower and the potentials of BL[0] and BL[m−1] are kept.

Note that at the point B, the output terminal of the NAND circuit 161 is set at a low potential by setting the pre-charge signal at a high potential, and the second transistor 163 is turned off, whereby pre-charge operation is stopped.

After a sufficient time for determining data (a time needed for determining the potential of the bit line BLx) passes, the latch signal (LAT) is set at a high potential. Here, the latch signal is set at a high potential at the point C, and the period BC is needed for determining data. At the point C (a timing in which the latch signal rises), the potential of the bit line BLx is determined and the output signal to the fourth wiring 175 is determined All of the potentials of the bit lines BLx are input to the input terminal of the latch circuit 191. Then, the output signal (OUTPUT) having a potential which reflects the resistance states of the antifuses 115 in the first row (a potential which reflects the potentials of the bit lines BLx) is output from the output terminal of the latch circuit 191 to the fourth wiring 175.

In the first transistor 113 in the memory cell MC(x, y) of FIG. 5, an oxide semiconductor is used in a channel formation region. An oxide semiconductor is used in the channel formation region, so that off current of the first transistor 113 is sufficiently reduced, whereby leakage from the short-circuited antifuse 115p in a row which is not selected in the reading period (the word line WLy) can be prevented. As a result, reduction of the potential of the bit line caused by a row which is not selected hardly occurs, and the potential of the bit line can be kept for a comparatively long period. Thus, reading in a parallel mode is possible.

Further, in a similar manner to Embodiment 1, leakage of the potential of the bit line BLx can be prevented when pre-charge operation is performed. Therefore, the pre-charge period can be shortened and the sufficient reading period can be secured, which can lead to improvement in reading accuracy.

In addition, since a transistor having sufficiently small off current is also used as the second transistor 163, change in the potential of the bit line during reading operation or difficulty in detecting the potential of the bit line due to leakage current of the second transistor 163 in the reading period can be prevented. Thus, incorrect data reading caused by leakage current can be prevented, so that accuracy of data reading can be improved.

In this manner, in the semiconductor memory device according to this embodiment, a transistor having sufficiently low off current is used as a transistor included in a memory cell and a transistor in a reading circuit, and leakage current influencing reading operation including pre-charge operation can be removed as much as possible, whereby data reading with high accuracy can be performed in a parallel mode.

Note that the structure described in this embodiment can be combined as appropriate with any structure described in the other embodiments in this specification.

[Embodiment 4]

According to this embodiment, high integration and downsizing of a semiconductor memory device are possible by using any of the structures of Embodiments 1 to 3.

There is a problem in that resistance fails to lower to a desired value and data cannot be read with accuracy in a state where an antifuse is not completely short-circuited. Therefore, it is known that a failure in reduction of the resistance of an antifuse to a desired value after short-circuiting is prevented and writing defects are prevented by connecting a capacitor called an "assist capacitor" in parallel to an antifuse to supply power for writing.

However, when an assist capacitor is provided, the area of a memory cell is increased by the area of the assist capacitor. Accordingly, the provision of an assist capacitor, which leads to, for example, increase of the area occupied by memory cell in the semiconductor memory device or increase of the size of the semiconductor memory device itself, prevents high integration or downsizing of a semiconductor memory device.

As described in Embodiments 1 to 3, in the semiconductor memory device according to this embodiment, transistors with sufficiently small off current are used as a transistor included in a memory cell (the first transistor 113) and a transistor in a reading circuit (the second transistor 163). As a result, leakage current influencing reading operation including pre-charge operation can be removed as much as possible, and therefore, a sufficient reading period can be secured.

Here, as described using (r) of FIG. 3, in the semiconductor memory device according to the embodiment, when a sufficiently long reading period is secured, data can be read even in a state where the antifuse is not completely short-circuited. Accordingly, the assist capacitor can be downsized or omitted, whereby reduction in the area of a memory cell and downsizing of the semiconductor memory device can be achieved.

The capacitor 117 in any of Embodiments 1 to 3 corresponds to an assist capacitor. Therefore, the capacitor 117 can be downsized or omitted.

In addition, as in Embodiment 3, the potentials of the m bit lines BLx can be read at one time by reading data in a parallel mode. Therefore, a reading period for one memory cell can be prolonged as compared to the case where data is read in a serial mode. As a result, the assist capacitor can be largely downsized or omitted completely. In addition, reading can be performed in a wider range of resistance values in the case where the antifuse is not completely short-circuited, whereby data reading accuracy can be improved.

Note that the structure described in this embodiment can be combined as appropriate with any structure described in the other embodiments in this specification.

[Embodiment 5]

In this embodiment, the structure of the memory cell described in any of Embodiments 1 to 4 will be described.

Figure 7A:
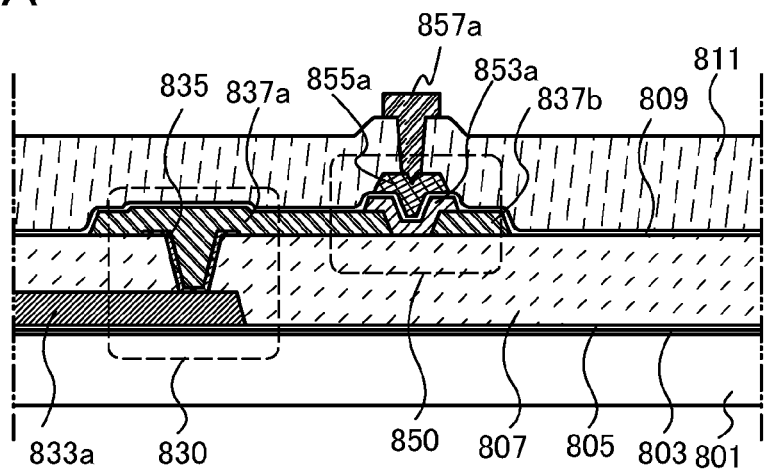
FIGS. 7A to 7C are schematic cross-sectional views each illustrating the structure of part of a memory cell.
Figure 7B:
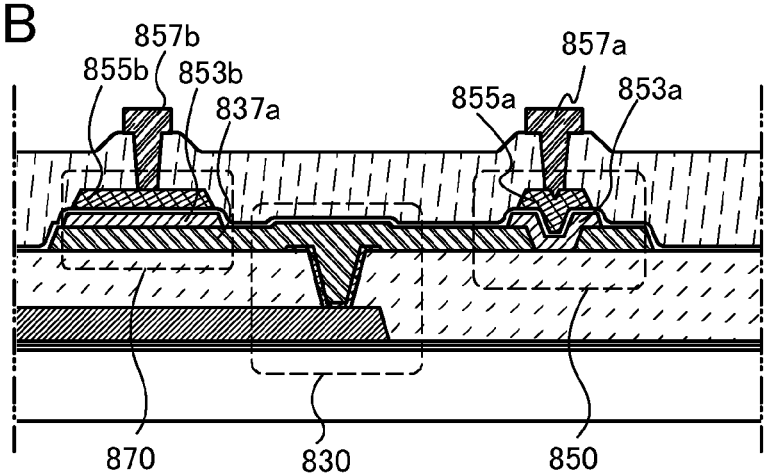
Figure 7C:
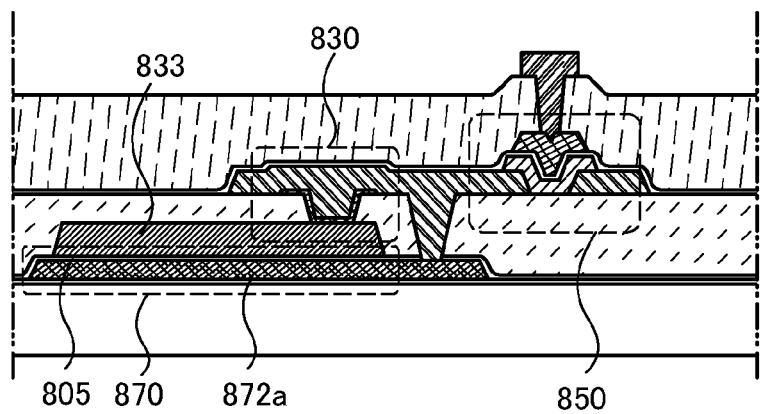

FIGS. 7A to 7C illustrate examples of a schematic cross-sectional view of part of a memory cell according to this embodiment.

In a memory cell illustrated in FIG. 7A, an antifuse 830 and a transistor 850 are provided. Here, the transistor 850 is provided above the antifuse 830.

The antifuse 830 includes a first conductive layer 833a provided over a substrate 801 with a first insulating layer 803 and a second insulating layer 805 provided therebetween, a resistance material layer 835 provided over the first conductive layer 833a, and a second conductive layer 837a provided over the resistance material layer 835. A third insulating layer 807 is provided over the first conductive layer 833a and the second insulating layer 805. The resistance material layer 835 is provided in an opening portion provided in the third insulating layer 807 and in contact with the first conductive layer 833a. The first conductive layer 833a, the second conductive layer 837a, and the resistance material layer 835 which is provided between the first conductive layer 833a and the second conductive layer 837a form the antifuse 830.

The first conductive layer 833a functions as one electrode of the antifuse 830. The resistance material layer 835 is formed using a material whose resistance state is changed (from a high resistance state to a low resistance state) by applying voltage to the antifuse 830. Specifically, the resistance material layer 835 is formed using a semiconductor layer (e.g., an amorphous silicon layer) or formed with a layered structure including a semiconductor layer and an insulating layer (e.g., a silicon oxide layer). The second conductive layer 837a functions as the other electrode of the antifuse 830.

The transistor 850 includes the second conductive layer 837a and a second conductive layer 837b provided over the third insulating layer 807, an oxide semiconductor layer 853a provided over the second conductive layer 837a and the second conductive layer 837b, and a third conductive layer 855a provided over the oxide semiconductor layer 853a with a fourth insulating layer 809 provided therebetween.

The third conductive layer 855a functions as a gate electrode. The second conductive layer 837a and the second conductive layer 837b function as a source electrode and a drain electrode. Note that the second conductive layer 837a functions as one of a source electrode and a drain electrode of the transistor 850, and the other electrode of the antifuse 830. The transistor 850 and the antifuse 830 are electrically connected to each other through the second conductive layer 837a. Note that the conductive layer functioning as the source electrode or the drain electrode of the transistor 850, and the electrode included in the antifuse 830 are not necessarily provided in the same layer as long as the conductive layer and the electrode are electrically connected to each other.

The structure of the transistor described in Embodiment 2 may be employed for the transistor 850. Here, the structure of the transistor 850 corresponds to that of the transistor 313 of FIG. 4A. The second conductive layer 837a and the second conductive layer 837b correspond to the conductive layer 305a and the conductive layer 305b of FIG. 4A. The oxide semiconductor layer 853a corresponds to the semiconductor layer 307 of FIG. 4A. The fourth insulating layer 809 corresponds to the gate insulating layer 309 of FIG. 4A. The third conductive layer 855a corresponds to the gate electrode 311 of FIG. 4A.

In addition, a fifth insulating layer 811 is provided over the antifuse 830 and the transistor 850. A fourth conductive layer 857a is provided over the fifth insulating layer 811. The fourth conductive layer 857a is provided in an opening portion provided in the fifth insulating layer 811 and in contact with the third conductive layer 855a. The fourth conductive layer 857a functions as a lead wiring (a gate lead wiring) of the third conductive layer 855a functioning as a gate electrode.

There is no limitation on the substrate 801 as long as it has resistance for manufacturing steps performed later, and a glass substrate or the like may be used.

The first insulating layer 803 and the second insulating layer 805 serve as bases for preventing diffusion of an impurity from the substrate 801. The third insulating layer 807 and the fifth insulating layer 811 function as interlayer insulating layers. The fourth insulating layer 809 functions as a gate insulating layer.

Each of the first insulating layer 803 to the fifth insulating layer 811 is formed with a single-layer structure using any of insulating layers of silicon oxide, silicon oxynitride, silicon nitride, hafnium oxide, aluminum oxide, tantalum oxide, and the like; or a layered structure including two or more layers selected from these insulating layers. In addition, each of the insulating layers functioning as interlayer insulating layers can also be formed using a resin material such as polyimide or acrylic. Note that insulating layers which contain hydrogen or water as little as possible are preferably used as the first insulating layer 803 to the fifth insulating layer 811.

A memory cell illustrated in FIG. 7B includes a capacitor 870 in addition to the structure illustrated in FIG. 7A. The capacitor 870 corresponds to an assist capacitor. Here, the transistor 850 and the capacitor 870 are provided above the antifuse 830.

The capacitor 870 includes the second conductive layer 837a, an oxide semiconductor layer 853b provided over the second conductive layer 837a, and a third conductive layer 855b over the oxide semiconductor layer 853b with the fourth insulating layer 809 provided therebetween. The second conductive layer 837a functions as one electrode of the capacitor 870. The third conductive layer 855b functions as the other electrode of the capacitor 870. The fourth insulating layer 809 provided between the second conductive layer 837a and the third conductive layer 855b functions as a dielectric layer.

In the capacitor 870, for example, the oxide semiconductor layer 853b is formed by processing the same layer as the oxide semiconductor layer 853a of the transistor 850, and the third conductive layer 855b is formed by processing the same layer as the third conductive layer 855a of the transistor 850. A process can be simplified by processing the same layer; however, this embodiment is not limited thereto and the layers may be formed using layers including different materials.

In addition, the second conductive layer 837a included in the capacitor 870 also functions as one of the source electrode and the drain electrode of the transistor 850 and one electrode of the antifuse 830. The transistor 850, the antifuse 830, and the capacitor 870 are electrically connected to each other through the second conductive layer 837a. Note that the second conductive layer 837a is not necessarily formed using a common layer to the transistor 850, the antifuse 830, and the capacitor 870 as long as the transistor 850, the antifuse 830, and the capacitor 870 are electrically connected to each other.

In addition, a fourth conductive layer 857b is provided in an opening portion provided in the fifth insulating layer 811. The fourth conductive layer 857b is in contact with the third conductive layer 855b. The fourth conductive layer 857b functions as a lead wiring (a capacitor lead wiring) of the third conductive layer 855b functioning as the other electrode of the capacitor 870.

A structure of FIG. 7C includes the capacitor 870 in addition to the structure of FIG. 7A. Further, the antifuse 830 is provided above the capacitor 870 and the transistor 850 is provided over the antifuse 830 in FIG. 7C.

The capacitor 870 includes a fifth conductive layer 872a, and a first conductive layer 833 provided over the fifth conductive layer 872a with the second insulating layer 805 provided therebetween. The fifth conductive layer 872a functions as one electrode of the capacitor 870. The first conductive layer 833 functions as the other electrode of the capacitor 870. The second insulating layer 805 provided between the fifth conductive layer 872a and the first conductive layer 833 functions as a dielectric layer.

The first conductive layer 833 included in the capacitor 870 also functions one electrode of the antifuse 830. In addition, the second conductive layer 837a is electrically connected to the fifth conductive layer 872a included in the capacitor 870, through an opening portion provided in the third insulating layer 807. The transistor 850, the antifuse 830, and the capacitor 870 are electrically connected to each other through the second conductive layer 837a.

In the memory cells illustrated in FIGS. 7A to 7C, when a transistor in which an oxide semiconductor layer is used in a channel formation region is used as the transistor electrically connected to the antifuse, leakage current can be prevented and reading accuracy for data stored in the memory cell can be increased.

In addition, when the transistor has the above structure, a long data reading period can be secured. Therefore, even when the antifuse is not completely short-circuited and resistance fails to lower sufficiently, a state in which the antifuse is short-circuited is obtained so that data can be read. Therefore, the capacitor functioning as an assist capacitor for supplying power in writing can be downsized or omitted. Consequently, the area of the memory cell can be reduced and downsizing of the semiconductor memory device can be achieved.

Figure 8:
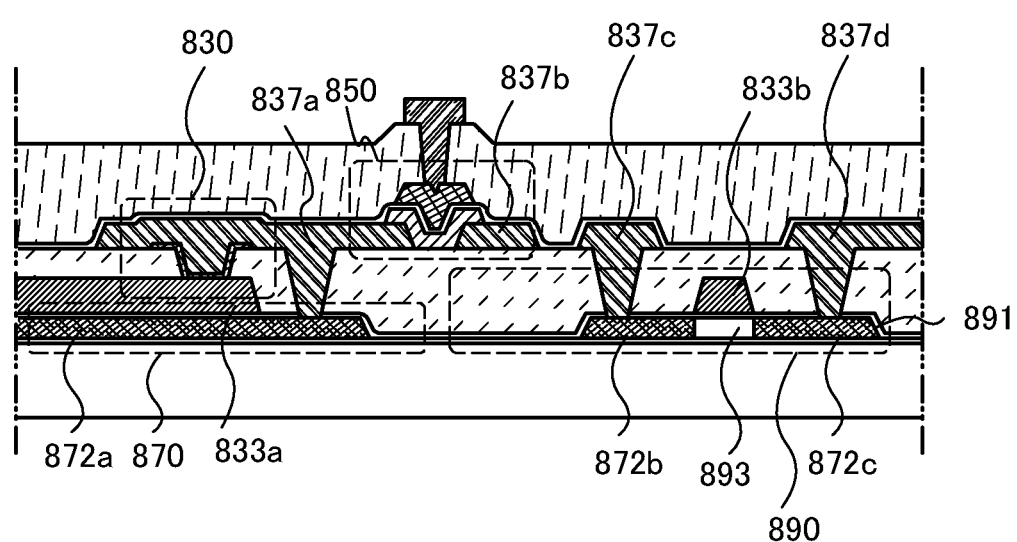
FIG. 8 is a schematic cross-sectional view illustrating the structure of part of a memory cell.

FIG. 8 shows an example of a schematic cross-sectional view illustrating part of the memory cell according to this embodiment and part of another circuit. FIG. 8 illustrates the antifuse 830, the transistor 850, and the capacitor 870 which are included in the memory cell, and a transistor 890 included in another circuit. Here, the antifuse 830 and the transistor 850 are provided above the capacitor 870 and the transistor 890.

Unlike the transistor 850, the transistor 890 is formed using a semiconductor such as silicon as a channel formation region. The transistor 890 includes a semiconductor layer 891, a first conductive layer 833*b* over the semiconductor layer 891 with the second insulating layer 805 provided therebetween, and a second conductive layer 837*c* and a second conductive layer 837*d* which are electrically connected to the semiconductor layer 891.

The semiconductor layer 891 includes a pair of impurity regions 872*b* and 872*c*, and a channel formation region 893 placed between the impurity regions 872*b* and 872*c*. The pair of impurity regions 872*b* and 872*c* function as source and drain regions. Note that a light doped drain (LDD) region, an offset region, or the like may be provided in the semiconductor layer 891 as appropriate.

The second conductive layer 837*c* and the second conductive layer 837*d* function as source and drain electrodes. One of the second conductive layer 837*c* and the second conductive layer 837*d* is electrically connected to one of the impurity regions 872*b* and 872*c*. The other of the second conductive layer 837*c* and the second conductive layer 837*d* is electrically connected to the other of the impurity regions 872*b* and 872*c*.

The first conductive layer 833*b* functions as a gate electrode. The second insulating layer 805 functions as a gate insulating layer. In addition, the second insulating layer 805 functions as a dielectric layer in the capacitor 870.

The semiconductor layer 891 in the transistor 890 is formed by processing the same layer as the fifth conductive layer 872*a* of the capacitor 870. Note that an impurity element imparting one conductivity type is added to each of the fifth conductive layer 872*a* and the impurity regions 872*b* and 872*c*. The first conductive layer 833*b* is formed by processing the same layer as the first conductive layer 833*a* of the antifuse 830. The second conductive layer 837*c* and the second conductive layer 837*d* are formed by processing the same layer as the second conductive layer 837*a* of the anti-fuse 830 and the transistor 850 and the second conductive layer 837*b* of the transistor 850. A process can be simplified by processing the same layer; however, this embodiment is not limited thereto and layers including different materials may be employed.

In this embodiment, a transistor in which an oxide semiconductor layer is used in a channel formation region is used as the transistor 850 electrically connected to the antifuse 830 in the memory cell. In another circuit, a transistor in which a semiconductor layer of silicon or the like is used in a channel formation region can be used appropriately.

Note that the structure described in this embodiment can be combined as appropriate with any structure described in the other embodiments in this specification.

[Embodiment 6]

In this embodiment, a specific structure of the semiconductor memory device according to any of the above embodiments will be described.

Figure 9:
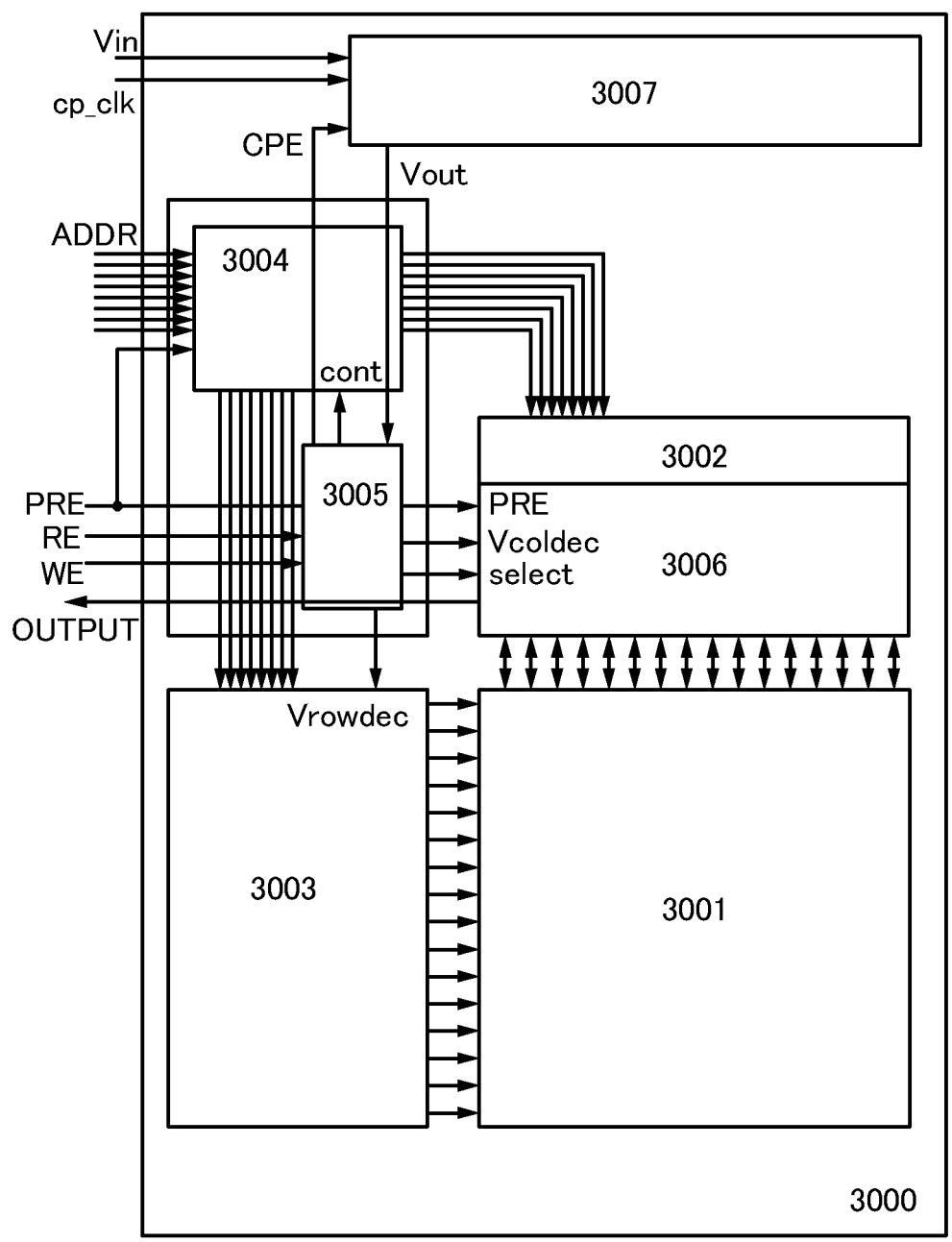
FIG. 9 is a block diagram showing the structure of a semiconductor memory device.

FIG. 9 is a block diagram illustrating an example of the structure of a memory portion in the semiconductor memory device. Note that in the block diagram in FIG. 9, circuits in the semiconductor memory device are classified in accordance with their functions and separated blocks are illustrated. However, it is difficult to classify actual circuits in accordance with their functions completely and, in some cases, one circuit has a plurality of functions.

A memory portion 3000 illustrated in FIG. 9 includes a memory cell array 3001, a column decoder 3002, a row decoder 3003, an address selector 3004, a selector 3005, a reading circuit/writing circuit 3006, and a boosting circuit 3007. Here, the memory cell array 3001 includes a plurality of memory cells arranged in a matrix.

The memory cells each correspond to the memory cell 111 in FIG. 1 or the memory cell MC(x, y) in FIG. 5. In addition, the memory cell is placed in an intersection portion of a bit line (the bit line 103 in FIG. 1 or the bit line BLx in FIG. 5) and a word line (the word line 105 in FIG. 1 or the word line WLy in FIG. 5).

Next, the operation of the memory portion 3000 is described. A read enable signal (RE), a write enable signal (WE), an address signal (ADDR), a pre-charge signal (PRE), and a boosting clock signal (CP_CLK) are input, as operation signals, to the memory portion 3000. A boosting input voltage (Vin) is input as power supply voltage. Note that although not shown particularly, power supply voltage necessary for driving the circuit, such as VDD or GND, is also input as operating power supply voltage.

The read enable signal (RE) and the write enable signal (WE) are input to the selector 3005 to determine the operation of the memory portion 3000. For example, in the case where the RE signal is active and the WE signal is non-active, reading operation is performed. Alternatively, in the case where the WE signal is active and the RE signal is non-active, writing operation is performed. In the case where the WE signal and the RE signal are both non-active, the memory is in a standby state.

In the case where writing operation is performed, the boosting circuit 3007 may be operated only when a boosting enable signal (CPE) is input. Thus, increase in current consumption due to unnecessary boosting can be suppressed. In addition, in the case where writing operation or reading operation is performed, when a control signal (cont) is input to the address selector 3004, a malfunction caused by driving a decoder (the column decoder 3002 or the row decoder 3003) in a standby state can be prevented.

The address signal (ADDR) is divided through the address selector 3004 and input to the column decoder 3002 and the row decoder 3003. The column decoder 3002 includes a plurality of decoders, and one or all of the decoders are driven in accordance with a combination of values of the address signal (ADDR). The row decoder 3003 includes a plurality of decoders, and one decoder is driven in accordance with a combination of values of the address signal (ADDR). Then, from the memory cell array 3001, a memory cell performing writing operation or reading operation is selected in accordance with a combination of decoders driven in the column decoder 3002 and the row decoder 3003.

Note that as described above, in a state where neither writing operation nor reading operation are performed (in a standby state), a signal entering the decoder (the column decoder 3002 or the row decoder 3003) is made non-active by the control signal (cont) input from the selector 3005 to the address selector 3004 so that the decoder is not selected.

In addition, when pre-charge operation is performed, the address signal input to the row decoder 3003 and the pre-charge signal (PRE) are ANDed so that the potential input to the word line is not high. In that case, during pre-charge operation, i.e., when the pre-charge signal (PRE) is set at a low potential, all of the address signals entering the row decoder 3003 are set at a low potential; therefore, potentials input to word lines in all of the columns are not high.

The reading circuit/writing circuit 3006 which is electrically connected to the column decoder 3002 drives either a reading circuit or a writing circuit by a selection signal (select) input from the selector 3005. The selection signal drives the writing circuit when writing operation is performed and drives the reading circuit when reading operation is performed.

The writing circuit includes a level shifter and a buffer. The signal selected by the column decoder 3002 is amplified to a writing voltage by the level shifter and input to a bit line through the buffer. Whether or not an antifuse in the memory cell is short-circuited is determined by the voltage input to the bit line and writing is performed.

The reading circuit has the structure described in any of Embodiments 1 to 3. Before the reading operation, the bit line is pre-charged by the pre-charge signal (PRE). Then, data "0" or data "1" is read from the potential of the bit line of the accessed memory cell and the read data is output as an output signal (OUTPUT).

The boosting circuit 3007 is operated by the cp_clk signal which is an input signal from the outside when the CPE signal input from the selector 3005 is active and amplifies the power supply voltage (Vin) which is input from the outside so that it is input to the selector 3005 as Vout. When the memory portion 3000 performs writing operation, Vout input to the selector 3005 becomes a power supply voltage (Vcoldec) of the reading circuit/writing circuit 3006 and a power supply voltage (Vrowdec) of the row decoder 3003. The writing circuit applies voltage which is sufficient for short-circuiting the antifuse of the selected memory cell to the selected bit line with the use of the level shifter. As the structure of the boosting circuit 3007, a known structure can be used.

When the structure of the memory portion 3000 includes the memory cell and the reading circuit which are described in any of Embodiments 1 to 3, reading accuracy in the memory portion 3000 can be improved. In addition, as described in Embodiment 4, the area of an assist capacitor can be reduced or an assist capacitor can be omitted; therefore, an area occupied by the memory cell array 3001 can be reduced in the memory portion 3000. Accordingly, high integration and downsizing of the semiconductor memory device are possible. Note that the effect becomes more advantageous as the number of memory cells included in the memory cell array 3001 is larger, in other words, the number of the memory bits is larger.

Note that the structure described in this embodiment can be combined as appropriate with any structure described in the other embodiments in this specification.

[Embodiment 7]

In this embodiment, a semiconductor device on which a semiconductor memory device is mounted will be described.

A semiconductor device according to this embodiment includes a memory portion therein, and stores information which is necessary for the memory portion. Then, information is exchanged with the outside by using contactless means (e.g., wireless communication). Such a semiconductor device is also referred to as an RFID tag and can be used for an individual authentication system by which individual information of articles or the like is stored in the semiconductor device, and the information is read to identify the articles.

Figure 10:
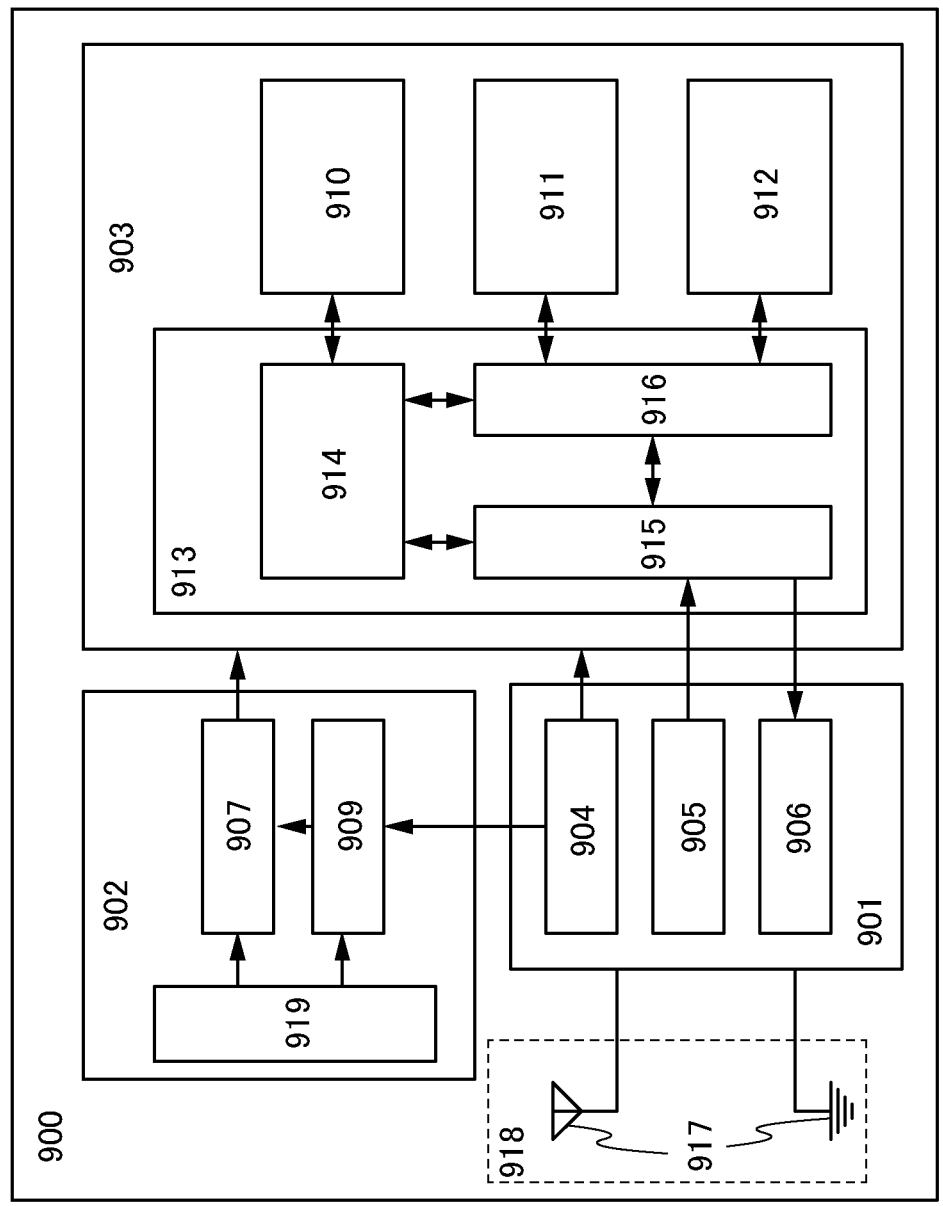
FIG. 10 is a block diagram showing the structure of a semiconductor device (an RFID tag)

FIG. 10 is a block diagram illustrating an example of the structure of a semiconductor device according to this embodiment. As illustrated in FIG. 10, a semiconductor device 900 includes a RF circuit 901, a clock generation circuit 902, a logic circuit 903, and an antenna portion 918. The antenna portion 918 includes an antenna 917.

Note that, although not shown in FIG. 10, the semiconductor device 900 transmits and receives a wireless signal to and from an external circuit such as a communication device (e.g., a wireless communication device such as a reader) via the antenna 917. Data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of the methods can be used in this embodiment.

The RF circuit 901 includes a power supply circuit 904, a demodulation circuit 905, and a modulation circuit 906. The clock generation circuit 902 includes a divider circuit 907, a counter circuit 909, and a reference clock generation circuit 919. The logic circuit 903 has a function of performing arithmetic processing, and includes a controller 913, a CPU (also referred to as a central processing unit) 910, a ROM 911, that is a read only memory, and a RAM 912 that is a random access memory.

In addition, the controller 913 includes a CPU interface 914, an RF interface 915, and a memory controller 916.

Further, in the RF circuit 901, the power supply circuit 904 includes a rectifier circuit and a storage capacitor, and has a function of generating power supply voltage from a received signal and supplying the power supply voltage to other circuits. The demodulation circuit 905 includes a rectifier circuit and an LPF (low-pass filter) and has a function of extracting a command or data from communication signals. The modulation circuit 906 has a function of modulating transmission data, and modulated data is transmitted as a transmission signal from the antenna 917.

Next, operation of the semiconductor device of this embodiment will be described.

First, a signal transmitted from an external communication device is received by the semiconductor device 900. The received signal which is input to the semiconductor device 900 is demodulated by the demodulation circuit 905 and then input to the RF interface 915 in the controller 913. The received signal input to the RF interface 915 is arithmetically processed in the CPU 910 through the CPU interface 914. In addition, with the received signal which is input to the RF interface 915, access to the ROM 911 and the RAM 912 is performed through the memory controller 916.

After arithmetic processing by the CPU 910 and input and output of data in the ROM 911 and/or the RAM 912, transmission data is generated. The transmission data is modulated as a signal by the modulation circuit 906 and transmitted from the antenna 917 to the external communication device.

The semiconductor memory device described in any of the above embodiments can be mounted as the ROM 911, the RAM 912, or another memory portion of the semiconductor device according to this embodiment. By mounting the semiconductor memory device according to any of the above embodiments on the semiconductor device according to this embodiment, the semiconductor device can be downsized. Therefore, when the semiconductor device is used as an RFID tag or the like, the range of uses can be expanded and the design of the semiconductor device can be improved.

The semiconductor device according to this embodiment will be described using schematic top views.

Figure 11A:
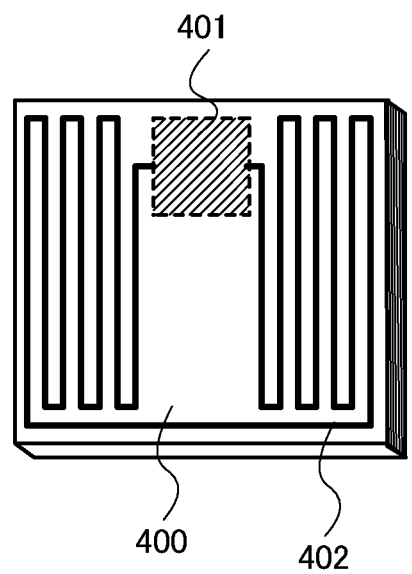
FIGS. 11A and 11B are schematic views each illustrating a top surface of a semiconductor device (an RFID tag)
Figure 11B:
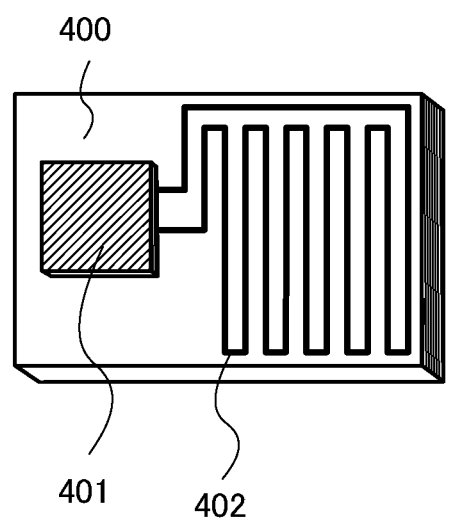
Figure 12A:
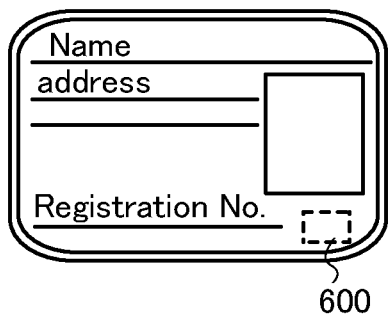
FIGS. 12A to 12F are schematic views each illustrating a usage example of a semiconductor device (an RFID tag).
Figure 12B:
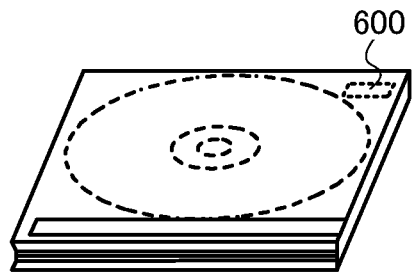
Figure 12C:
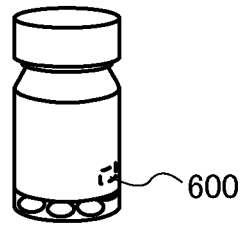
Figure 12D:
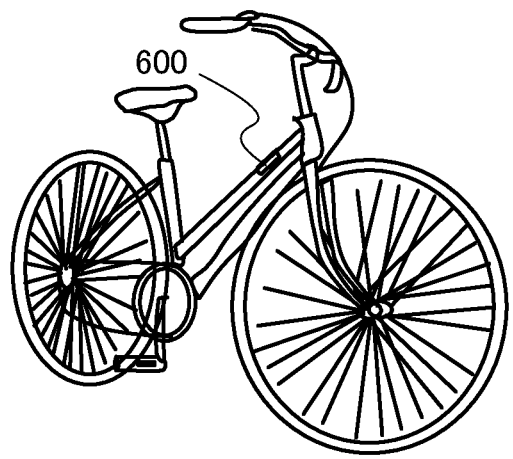
Figure 12E:
Figure 12F:
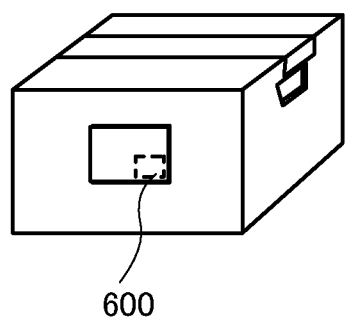

A semiconductor device illustrated in FIG. 11A includes a substrate 400, an element portion 401 which is provided for the substrate 400, and an antenna 402 which is electrically connected to the element portion 401. In addition, FIG. 11B illustrates an example in which an antenna 402 which has a different structure from that of FIG. 11A is included. Here, the antenna 402 corresponds to the antenna 917 of FIG. 10, and the element portion 401 corresponds to structures except the antenna portion 918 (i.e., the RF circuit 901, the clock generation circuit 902, and the logic circuit 903) of FIG. 10.

The semiconductor memory device described in any of the above embodiments is used for such semiconductor devices described in FIGS. 11A and 11B, whereby the area of the element portion 401 can be reduced. Therefore, the semiconductor device itself can be downsized.

Next, usage examples of the semiconductor device (RFID tag) according to this embodiment, on which the semiconductor memory device is mounted are described using FIGS. 12A to 12F. A semiconductor device 600 illustrated in FIGS. 12A to 12F corresponds to the semiconductor device in any of FIG. 10 and FIGS. 11A and 11B.

The semiconductor device according to this embodiment can be used in a wide variety of applications. For example, the semiconductor device 600 according to this embodiment can be used for the following: bills; coins; securities; bearer bonds; certificates (e.g., driver's licenses or resident cards, see FIG. 12A); recording media (e.g., DVD software or video tapes, see FIG. 12B); containers for wrapping objects (e.g., wrapping paper or bottles, see FIG. 12C); vehicles (e.g., bicycles, see FIG. 12D); belongings (e.g., bags or glasses, see FIG. 12E); foods; plants; animals; human bodies; clothes; commodities; electronic devices (liquid crystal display devices, EL display devices, television sets, or mobile phones); labels attaching to these articles (see FIG. 12F); or the like.

The semiconductor device 600 can be fixed to an article, for example, by being mounted on the article, attached to a surface of the article, embedded in the article, or the like. For example, the semiconductor device 600 can be fixed to a book that is an article by being embedded in paper. In addition, in the case where the semiconductor device 600 is fixed as a package formed from an organic resin to the article, the semiconductor device 600 can be fixed by being embedded in the organic resin.

Since the semiconductor device 600 according to this embodiment can be downsized, the design of the article itself is not impaired when the semiconductor device 600 is fixed to the article. In addition, when the semiconductor device 600 is provided for bills, coins, securities, bearer bonds, certificates, or the like, an authentication function can be provided, and forgery of bills or the like can be prevented by utilizing the authentication function. Further, when the semiconductor device 600 is attached to containers for wrapping objects, recording media, personal belongings, foods, clothes, commodities, electronic devices, or the like, a system such as an inspection system can be efficiently used. Furthermore, when the semiconductor device 600 is attached to the vehicles, the vehicles can have higher security against theft or the like.

As described above, the semiconductor device on which the semiconductor memory device is mounted, according to this embodiment, can be used for a wide variety of uses. The semiconductor device according to this embodiment can perform data reading with high accuracy, which can lead to improvement of reliability of authentication characteristics, security, or the like of an article.

Note that the structure described in this embodiment can be combined as appropriate with any structure described in the other embodiments in this specification.

This application is based on Japanese Patent Application serial no. 2010-089968 filed with Japan Patent Office on Apr. 9, 2010, the entire contents of which are hereby incorporated by reference.

Explanation of Reference

101: memory cell array; 103: bit line; 105: word line; 111: memory cell; 113: first transistor; 115: antifuse; 117: capacitor; 119: ground potential; 151: reading circuit; 152: pre-charge circuit; 153: first wiring; 155: second wiring; 157: third wiring; 161: NAND circuit; 163: second transistor; 173: clocked inverter; 175: fourth wiring; 181: switch; 191: latch circuit; 193: wiring; 303: insulating surface; 307: semiconductor layer; 309: gate insulating layer; 311: gate electrode; 313: transistor; 315: passivation layer; 317: channel protective layer; 323: transistor; 333: transistor; 400: substrate; 401: element portion; 402: antenna; 600: semiconductor device; 801: substrate; 803: insulating layer; 805: insulating layer; 807: insulating layer; 809: insulating layer; 811: insulating layer; 830: antifuse; 833: conductive layer; 835: resistance material layer; 850: transistor; 870: capacitor; 890: transistor; 891: semiconductor layer; 893: channel formation region; 900: semiconductor device; 901: RF circuit; 902: clock generation circuit; 903: logic circuit; 904: power supply circuit; 905: demodulation circuit; 906: modulation circuit; 907: divider circuit; 909: counter circuit; 910: CPU; 911: ROM; 912: RAM; 913: controller; 914: CPU interface; 915: RF interface; 916: memory controller; 917: antenna; 918: antenna portion; 919: reference clock generation circuit; 115p: antifuse; 115q: antifuse; 3000: memory portion; 3001: memory cell array; 3002: column decoder; 3003: row decoder; 3004: address selector; 3005: selector; 3006: circuit; 3007: boosting circuit; 305a: conductive layer; 305b: conductive layer; 833a: conductive layer; 833b: conductive layer; 837a: conductive layer; 837b: conductive layer; 837c: conductive layer; 837d: conductive layer; 853a: oxide semiconductor layer; 853b: oxide semiconductor layer; 855a: conductive layer; 855b: conductive layer; 857a: conductive layer; 857b: conductive layer; 872a: conductive layer; 872b: impurity region; 872c: impurity region.

The invention claimed is:

1. A semiconductor memory device comprising:
a memory cell including a first transistor and a memory element;
a pre-charge circuit including a second transistor;
a clocked inverter; and
a switch,
wherein a gate of the first transistor is electrically connected to a first line, one of a source and a drain of the first transistor is electrically connected to a second line, and the other of the source and the drain of the first transistor is electrically connected to one electrode of the memory element,
wherein one of a source and a drain of the second transistor is electrically connected to a third line, and the other of the source and the drain of the second transistor is electrically connected to one terminal of the switch and an input terminal of the clocked inverter,
wherein an output terminal of the clocked inverter is electrically connected to an output signal line,
wherein the other terminal of the switch is electrically connected to the second line,
wherein a channel formation region of the first transistor and a channel formation region of the second transistor each include an oxide semiconductor, and
wherein an off current value of the first transistor is lower than or equal to 10 aA/μm.

2. The semiconductor memory device according to claim 1,
wherein the pre-charge circuit further includes a NAND circuit,
wherein a gate of the second transistor is electrically connected to an output terminal of the NAND circuit,
wherein one input terminal of the NAND circuit is electrically connected to an address signal line, and wherein the other input terminal of the NAND circuit is electrically connected to a pre-charge signal line.

3. The semiconductor memory device according to claim 1, wherein the memory cell further includes a capacitor,
wherein the other of the source and the drain of the first transistor is electrically connected to one electrode of the capacitor.

4. The semiconductor memory device according to claim 1, wherein the second line is pre-charged by the pre-charge circuit before performing reading operation of the memory cell.

5. The semiconductor memory device according to claim 1, wherein the third line is a power supply line, and the second line is pre-charged with a power supply potential inputted from the power supply line by the pre-charge circuit.

6. A semiconductor device comprising the semiconductor memory device according to claim 1.

7. A semiconductor memory device comprising:
m first lines (m is an integer of 1 or more);
n second lines (n is an integer of 1 or more);
(m×n) memory cells, each one of the (m×n) memory cells includes a first transistor and a memory element;
m reading circuits, each one of m reading circuits is electrically connected to a corresponding one of the m first lines, each one of the m reading circuits including:
a pre-charge circuit including a second transistor; and
a switch, and
a latch circuit electrically connected to the m reading circuits,
wherein a gate of the first transistor is electrically connected to a corresponding one of the n second lines, one of a source and a drain of the first transistor is electrically connected to a corresponding one of the m first lines, and the other of the source and the drain of the first transistor is electrically connected to one electrode of the memory element,
wherein one of a source and a drain of the second transistor is electrically connected to a third line, and the other of the source and the drain of the second transistor is electrically connected to one terminal of the switch and an input terminal of the latch circuit,
wherein an output terminal of the latch circuit is electrically connected to an output signal line,
wherein the other terminal of the switch is electrically connected to the one of the source and the drain of the first transistor,
wherein a channel formation region of the first transistor and a channel formation region of the second transistor each include an oxide semiconductor, and
wherein an off current value of the first transistor is lower than or equal to 10 aA/μm.

8. The semiconductor memory device according to claim 7, wherein the pre-charge circuit further includes a NAND circuit,
wherein a gate of the second transistor is electrically connected to an output terminal of the NAND circuit,
wherein one input terminal of the NAND circuit is electrically connected to an address signal line, and
wherein the other input terminal of the NAND circuit is electrically connected to a pre-charge signal line.

9. The semiconductor memory device according to claim 7, wherein the each one of the (m×n) memory cells further includes a capacitor,
wherein the other of the source and the drain of the first transistor is electrically connected to one electrode of the capacitor.

10. The semiconductor memory device according to claim 7, wherein reading of memory cells electrically connected to the same first line is performed at the same time.

11. The semiconductor memory device according to claim 10, wherein the m first lines are pre-charged by the pre-charge circuit included in the m reading circuits before performing reading operation.

12. The semiconductor memory device according to claim 7, wherein the third line is a power supply line, and corresponding one of the m first lines is pre-charged with a power supply potential inputted from the power supply line by the pre-charge circuit.

13. A semiconductor device comprising the semiconductor memory device according to claim 7.

14. A semiconductor memory device comprising:
a memory cell including a first transistor and a memory element;
a pre-charge circuit including a second transistor;
a clocked inverter; and
a switch,
wherein a gate of the first transistor is electrically connected to a first line, one of a source and a drain of the first transistor is electrically connected to a second line, and the other of the source and the drain of the first transistor is electrically connected to one electrode of the memory element,
wherein one of a source and a drain of the second transistor is electrically connected to a third line, and the other of the source and the drain of the second transistor is electrically connected to one terminal of the switch and an input terminal of the clocked inverter,
wherein an output terminal of the clocked inverter is electrically connected to an output signal line,
wherein the other terminal of the switch is electrically connected to the second line,
wherein a channel formation region of the first transistor and a channel formation region of the second transistor each include an oxide semiconductor,
wherein an off current value of the first transistor is lower than or equal to 10 aA/μm, and
wherein the second line is configured to be charged by the pre-charge circuit before performing reading operation of the memory cell.

15. The semiconductor memory device according to claim 14,
wherein the pre-charge circuit further includes a NAND circuit,
wherein a gate of the second transistor is electrically connected to an output terminal of the NAND circuit,
wherein one input terminal of the NAND circuit is electrically connected to an address signal line, and
wherein the other input terminal of the NAND circuit is electrically connected to a pre-charge signal line.

16. The semiconductor memory device according to claim 14,
wherein the memory cell further includes a capacitor,
wherein the other of the source and the drain of the first transistor is electrically connected to one electrode of the capacitor.

17. The semiconductor memory device according to claim 14, wherein the third line is a power supply line, and the second line is pre-charged with a power supply potential inputted from the power supply line by the pre-charge circuit.

18. A semiconductor device comprising the semiconductor memory device according to claim 14.

19. A semiconductor memory device comprising:
m first lines (m is an integer of 1 or more);

n second lines (n is an integer of 1 or more);

(m×n) memory cells, each one of the (m×n) memory cells includes a first transistor and a memory element;

m reading circuits electrically connected to a corresponding one of the m first lines, each one of the m reading circuits including:
 a pre-charge circuit including a second transistor; and
 a switch, and a latch circuit electrically connected to the m reading circuits, wherein a gate of the first transistor is electrically connected to a corresponding one of the n second lines, one of a source and a drain of the first transistor is electrically connected to a corresponding one of the m first lines, and the other of the source and the drain of the first transistor is electrically connected to one electrode of the memory element, wherein one of a source and a drain of the second transistor is electrically connected to a third line, and the other of the source and the drain of the second transistor is electrically connected to one terminal of the switch and an input terminal of the latch circuit, wherein an output terminal of the latch circuit is electrically connected to an output signal line, wherein the other terminal of the switch is electrically connected to the one of the source and the drain of the first transistor, wherein a channel formation region of the first transistor and a channel formation region of the second transistor each include an oxide semiconductor, wherein an off current value of the first transistor is lower than or equal to 10 aA/μm, and wherein each one of the m first lines is configured to be charged by a corresponding one of m pre-charge circuits before performing reading operation of a corresponding one of (m×n) memory cells.

20. The semiconductor memory device according to claim 19,
wherein the pre-charge circuit further includes a NAND circuit,
wherein a gate of the second transistor is electrically connected to an output terminal of the NAND circuit,
wherein one input terminal of the NAND circuit is electrically connected to an address signal line, and
wherein the other input terminal of the NAND circuit is electrically connected to a pre-charge signal line.

21. The semiconductor memory device according to claim 19,
wherein the each one of the (m×n) memory cells further includes a capacitor,
wherein the other of the source and the drain of the first transistor is electrically connected to one electrode of the capacitor.

22. The semiconductor memory device according to claim 19, wherein reading of memory cells electrically connected to the same first line is performed at the same time.

23. The semiconductor memory device according to claim 19, wherein the third line is a power supply line, and corresponding one of the m first lines is pre-charged with a power supply potential inputted from the power supply line by the pre-charge circuit.

24. A semiconductor device comprising the semiconductor memory device according to claim 19.

25. The semiconductor memory device according to claim 14, wherein the memory element is an antifuse.

26. The semiconductor memory device according to claim 19, wherein the memory element is an antifuse.

* * * * *